(12) United States Patent
Myo et al.

(10) Patent No.: US 8,282,992 B2
(45) Date of Patent: Oct. 9, 2012

(54) METHODS FOR ATOMIC LAYER DEPOSITION OF HAFNIUM-CONTAINING HIGH-K DIELECTRIC MATERIALS

(75) Inventors: Nyi Oo Myo, Campbell, CA (US);
Kenric Cho, Santa Calra, CA (US);
Shreyas Kher, Campbell, CA (US);
Pravin Narwankar, Sunnyvale, CA (US); Steve Poppe, Pleasanton, CA (US); Craig R. Metzner, Fremont, CA (US); Paul Deaten, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 726 days.

(21) Appl. No.: 11/925,681

(22) Filed: Oct. 26, 2007

(65) Prior Publication Data

US 2008/0044569 A1    Feb. 21, 2008

Related U.S. Application Data

(62) Division of application No. 11/127,753, filed on May 12, 2005.

(60) Provisional application No. 60/570,173, filed on May 12, 2004.

(51) Int. Cl.
*C23C 16/00* (2006.01)

(52) U.S. Cl. .................................................. 427/248.1

(58) Field of Classification Search .............. 427/248.1
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,415,275 A | 11/1983 | Dietrich | |
| 4,486,487 A | 12/1984 | Skarp et al. | |

(Continued)

FOREIGN PATENT DOCUMENTS

EP    0464515    1/1992

(Continued)

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001) pp. K2.1.1-K2.1.11.

(Continued)

*Primary Examiner* — Kelly M Gambetta
(74) *Attorney, Agent, or Firm* — Patterson & Sheridan, LLP

(57) ABSTRACT

Embodiments of the invention provide methods for depositing materials on substrates during vapor deposition processes, such as atomic layer deposition (ALD). In one embodiment, a chamber contains a substrate support with a receiving surface and a chamber lid containing an expanding channel formed within a thermally insulating material. The chamber further includes at least one conduit coupled to a gas inlet within the expanding channel and positioned to provide a gas flow through the expanding channel in a circular direction, such as a vortex, a helix, a spiral, or derivatives thereof. The expanding channel may be formed directly within the chamber lid or formed within a funnel liner attached thereon. The chamber may contain a retaining ring, an upper process liner, a lower process liner or a slip valve liner. Liners usually have a polished surface finish and contain a thermally insulating material such as fused quartz or ceramic. In an alternative embodiment, a deposition system contains a catalytic water vapor generator connected to an ALD chamber.

18 Claims, 11 Drawing Sheets

U.S. PATENT DOCUMENTS

| | | | |
|---|---|---|---|
| 4,693,208 A | 9/1987 | Sakai et al. |
| 4,761,269 A | 8/1988 | Conger et al. |
| 4,825,809 A | 5/1989 | Mieno et al. |
| 4,834,831 A | 5/1989 | Nishizawa et al. |
| 4,947,790 A | 8/1990 | Gartner et al. |
| 4,975,252 A | 12/1990 | Nishizawa et al. |
| 4,993,357 A | 2/1991 | Scholz et al. |
| 5,027,746 A | 7/1991 | Frijlink et al. |
| 5,173,327 A | 12/1992 | Sandhu et al. |
| 5,178,681 A | 1/1993 | Moore et al. |
| 5,224,202 A | 6/1993 | Arnold et al. |
| 5,225,366 A | 7/1993 | Yoder |
| 5,229,081 A | 7/1993 | Suda |
| 5,261,959 A | 11/1993 | Gasworth |
| 5,281,274 A | 1/1994 | Yoder |
| 5,290,609 A | 3/1994 | Horiike et al. |
| 5,294,286 A | 3/1994 | Nishizawa et al. |
| 5,306,666 A | 4/1994 | Izumi et al. |
| 5,338,362 A | 8/1994 | Imahashi et al. |
| 5,374,570 A | 12/1994 | Nasu et al. |
| 5,441,703 A | 8/1995 | Jurgensen et al. |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,521,126 A | 5/1996 | Okamura et al. |
| 5,526,244 A | 6/1996 | Bishop |
| 5,558,717 A | 9/1996 | Zhao et al. |
| 5,580,421 A | 12/1996 | Hiatt et al. |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,834,372 A | 11/1998 | Lee et al. |
| 5,835,677 A | 11/1998 | Li et al. |
| 5,846,332 A | 12/1998 | Zhao et al. |
| 5,855,680 A | 1/1999 | Soininen et al. |
| 5,879,459 A | 3/1999 | Gadgil et al. |
| 5,882,411 A | 3/1999 | Zhao et al. |
| 5,906,683 A | 5/1999 | Chen et al. |
| 5,916,365 A | 6/1999 | Sherman |
| 5,923,056 A | 7/1999 | Lee et al. |
| 5,972,430 A | 10/1999 | DiMeo, Jr. et al. |
| 5,989,345 A | 11/1999 | Hatano et al. |
| 6,001,267 A | 12/1999 | Os et al. |
| 6,001,420 A | 12/1999 | Mosely et al. |
| 6,013,553 A | 1/2000 | Wallace et al. |
| 6,015,590 A | 1/2000 | Suntola et al. |
| 6,015,917 A | 1/2000 | Bhandari et al. |
| 6,020,243 A | 2/2000 | Wallace et al. |
| 6,025,627 A | 2/2000 | Forbes et al. |
| 6,042,652 A | 3/2000 | Hyun et al. |
| 6,043,177 A | 3/2000 | Falconer et al. |
| 6,060,755 A | 5/2000 | Ma et al. |
| 6,071,572 A | 6/2000 | Mosely et al. |
| 6,079,356 A | 6/2000 | Umotoy et al. |
| 6,084,302 A | 7/2000 | Sandhu |
| 6,099,904 A | 8/2000 | Mak et al. |
| 6,117,244 A * | 9/2000 | Bang et al. ............ 118/715 |
| 6,124,158 A | 9/2000 | Dautartas et al. |
| 6,139,700 A | 10/2000 | Kang et al. |
| 6,143,077 A | 11/2000 | Ikeda et al. |
| 6,143,082 A | 11/2000 | McInerney et al. |
| 6,143,659 A | 11/2000 | Leem et al.. |
| 6,144,060 A | 11/2000 | Park et al. |
| 6,156,382 A | 12/2000 | Rajagopalan et al. |
| 6,162,715 A | 12/2000 | Mak et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,207,302 B1 | 3/2001 | Sugiura et al. |
| 6,207,487 B1 | 3/2001 | Kim et al. |
| 6,231,672 B1 | 5/2001 | Choi et al. |
| 6,238,734 B1 | 5/2001 | Senzaki et al. |
| 6,251,190 B1 | 6/2001 | Mak et al. |
| 6,270,572 B1 | 8/2001 | Kim et al. |
| 6,270,839 B1 | 8/2001 | Onoe et al. |
| 6,284,646 B1 | 9/2001 | Leem et al. |
| 6,287,965 B1 | 9/2001 | Kang et al. |
| 6,291,283 B1 | 9/2001 | Wilk |
| 6,291,867 B1 | 9/2001 | Wallace et al. |
| 6,296,711 B1 | 10/2001 | Loan et al. |
| 6,297,172 B1 | 10/2001 | Kashiwagi et al. |
| 6,297,539 B1 | 10/2001 | Ma et al. |
| 6,299,294 B1 | 10/2001 | Regan |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,335,240 B1 | 1/2002 | Kim et al. |
| 6,342,277 B1 | 1/2002 | Sherman |
| 6,348,376 B2 | 2/2002 | Lim et al. |
| 6,348,386 B1 | 2/2002 | Gilmer |
| 6,358,829 B2 | 3/2002 | Yoon et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,279 B1 | 7/2002 | Ono et al. |
| 6,428,847 B1 | 8/2002 | Grant et al. |
| 6,428,859 B1 | 8/2002 | Chiang et al. |
| 6,433,314 B1 | 8/2002 | Mandrekar et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,452,229 B1 | 9/2002 | Krivokapic |
| 6,452,338 B1 | 9/2002 | Horsky |
| 6,454,860 B2 | 9/2002 | Metzner et al. |
| 6,458,701 B1 | 10/2002 | Chae et al. |
| 6,462,367 B2 | 10/2002 | Marsh et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,489,214 B2 | 12/2002 | Kim et al. |
| 6,492,283 B2 | 12/2002 | Raaijmakers et al. |
| 6,498,091 B1 | 12/2002 | Chen et al. |
| 6,511,539 B1 | 1/2003 | Raaijmakers et al. |
| 6,520,218 B1 | 2/2003 | Gregg et al. |
| 6,524,952 B1 | 2/2003 | Srinivas et al. |
| 6,534,395 B2 | 3/2003 | Werkhoven et al. |
| 6,548,112 B1 | 4/2003 | Hillman et al. |
| 6,548,424 B2 | 4/2003 | Putkonen et al. |
| 6,551,406 B2 | 4/2003 | Kilpi et al. |
| 6,551,929 B1 | 4/2003 | Kori et al. |
| 6,558,509 B2 | 5/2003 | Kraus et al. |
| 6,561,498 B2 | 5/2003 | Tompkins et al. |
| 6,569,501 B2 | 5/2003 | Chiang et al. |
| 6,572,705 B1 | 6/2003 | Suntola et al. |
| 6,578,287 B2 | 6/2003 | Aswad |
| 6,579,372 B2 | 6/2003 | Park |
| 6,585,823 B1 | 7/2003 | Van Wijck et al. |
| 6,593,484 B2 | 7/2003 | Yasuhara et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,607,973 B1 | 8/2003 | Jeon |
| 6,607,976 B2 | 8/2003 | Chen et al. |
| 6,613,383 B1 | 9/2003 | George et al. |
| 6,620,670 B2 | 9/2003 | Song et al. |
| 6,620,723 B1 | 9/2003 | Byun et al. |
| 6,630,030 B1 | 10/2003 | Suntola et al. |
| 6,630,201 B2 | 10/2003 | Chiang et al. |
| 6,630,413 B2 | 10/2003 | Todd |

| | | | | | | |
|---|---|---|---|---|---|---|
| 6,632,279 | B1 | 10/2003 | Ritala et al. | 7,085,616 B2 | 8/2006 | Chin et al. |
| 6,632,747 | B2 | 10/2003 | Niimi et al. | 7,094,680 B2 | 8/2006 | Seutter et al. |
| 6,660,126 | B2 | 12/2003 | Nguyen et al. | 7,094,685 B2 | 8/2006 | Yang et al. |
| 6,660,622 | B2 | 12/2003 | Chen et al. | 7,175,713 B2 | 2/2007 | Thakur et al. |
| 6,660,659 | B1 | 12/2003 | Kraus et al. | 7,186,385 B2 | 3/2007 | Ganguli et al. |
| 6,660,660 | B2 | 12/2003 | Haukka et al. | 7,201,803 B2 | 4/2007 | Lu et al. |
| 6,674,138 | B1 | 1/2004 | Halliyal et al. | 7,204,886 B2 | 4/2007 | Chen et al. |
| 6,677,247 | B2 | 1/2004 | Yuan et al. | 7,208,413 B2 | 4/2007 | Byun et al. |
| 6,686,271 | B2 | 2/2004 | Raaijmakers et al. | 7,211,508 B2 | 5/2007 | Chung et al. |
| 6,713,177 | B2 | 3/2004 | George et al. | 7,222,636 B2 | 5/2007 | Nguyen et al. |
| 6,713,846 | B1 | 3/2004 | Senzaki | 7,228,873 B2 | 6/2007 | Ku et al. |
| 6,716,287 | B1 | 4/2004 | Santiago et al. | 7,270,709 B2 | 9/2007 | Chen et al. |
| 6,718,126 | B2 | 4/2004 | Lei | 7,294,208 B2 | 11/2007 | Guenther |
| 6,720,027 | B2 | 4/2004 | Yang et al. | 7,402,210 B2 | 7/2008 | Chen et al. |
| 6,734,020 | B2 | 5/2004 | Lu et al. | 7,408,225 B2 | 8/2008 | Shinriki et al. |
| 6,740,585 | B2 | 5/2004 | Yoon et al. | 7,794,544 B2 | 9/2010 | Nguyen et al. |
| 6,772,072 | B2 | 8/2004 | Ganguli et al. | 2001/0000866 A1 | 5/2001 | Sneh et al. |
| 6,773,507 | B2 | 8/2004 | Jallepally et al. | 2001/0002280 A1 | 5/2001 | Sneh |
| 6,777,352 | B2 | 8/2004 | Tepman et al. | 2001/0009140 A1 | 7/2001 | Bondestam et al. |
| 6,778,762 | B1 | 8/2004 | Shareef et al. | 2001/0009695 A1 | 7/2001 | Saanila et al. |
| 6,784,096 | B2 | 8/2004 | Chen et al. | 2001/0011526 A1 | 8/2001 | Doering et al. |
| 6,790,773 | B1 | 9/2004 | Drewery et al. | 2001/0013312 A1 | 8/2001 | Soininen et al. |
| 6,797,108 | B2 | 9/2004 | Wendling | 2001/0014371 A1 | 8/2001 | Kilpi |
| 6,800,173 | B2 | 10/2004 | Chiang et al. | 2001/0021589 A1 | 9/2001 | Wilk |
| 6,803,272 | B1 | 10/2004 | Halliyal et al. | 2001/0024387 A1 | 9/2001 | Raaijmakers et al. |
| 6,815,285 | B2 | 11/2004 | Choi et al. | 2001/0024871 A1 | 9/2001 | Yagi |
| 6,818,094 | B2 | 11/2004 | Yudovsky | 2001/0025979 A1 | 10/2001 | Kim et al. |
| 6,818,250 | B2 | 11/2004 | George et al. | 2001/0028924 A1 | 10/2001 | Sherman |
| 6,821,563 | B2 | 11/2004 | Yudovsky | 2001/0029092 A1 | 10/2001 | Park et al. |
| 6,825,134 | B2 | 11/2004 | Law et al. | 2001/0029891 A1 | 10/2001 | Oh et al. |
| 6,827,815 | B2 | 12/2004 | Hytros et al. | 2001/0034123 A1 | 10/2001 | Jeon et al. |
| 6,830,618 | B2 * | 12/2004 | Hara et al. ............ 117/200 | 2001/0041250 A1 | 11/2001 | Werkhoven et al. |
| 6,831,004 | B2 | 12/2004 | Byun et al. | 2001/0042523 A1 | 11/2001 | Kesala |
| 6,831,021 | B2 | 12/2004 | Chua et al. | 2001/0042799 A1 | 11/2001 | Kim et al. |
| 6,838,125 | B2 | 1/2005 | Chung et al. | 2001/0048907 A1* | 12/2001 | Ohmi et al. ............ 422/186.29 |
| 6,841,200 | B2 | 1/2005 | Kraus et al. | 2001/0050039 A1 | 12/2001 | Park |
| 6,846,516 | B2 | 1/2005 | Yang et al. | 2001/0054377 A1 | 12/2001 | Lindfors et al. |
| 6,849,545 | B2 | 2/2005 | Mak et al. | 2001/0054730 A1 | 12/2001 | Kim et al. |
| 6,858,547 | B2 | 2/2005 | Metzner et al. | 2001/0054769 A1 | 12/2001 | Raaijmakers et al. |
| 6,861,356 | B2 | 3/2005 | Matsuse et al. | 2002/0000196 A1 | 1/2002 | Park |
| 6,866,746 | B2 | 3/2005 | Lei et al. | 2002/0000598 A1 | 1/2002 | Kang et al. |
| 6,868,859 | B2 | 3/2005 | Yudovsky | 2002/0005168 A1 | 1/2002 | Kraus et al. |
| 6,869,838 | B2 | 3/2005 | Law et al. | 2002/0005556 A1 | 1/2002 | Cartier et al. |
| 6,875,271 | B2 | 4/2005 | Glenn et al. | 2002/0007790 A1 | 1/2002 | Park |
| 6,878,206 | B2 | 4/2005 | Tzu et al. | 2002/0008297 A1 | 1/2002 | Park et al. |
| 6,881,437 | B2 | 4/2005 | Ivanov et al. | 2002/0009544 A1 | 1/2002 | McFeely et al. |
| 6,893,915 | B2 | 5/2005 | Park et al. | 2002/0009896 A1 | 1/2002 | Sandhu et al. |
| 6,897,106 | B2 | 5/2005 | Park et al. | 2002/0014647 A1 | 2/2002 | Seidl et al. |
| 6,902,624 | B2 | 6/2005 | Seidel et al. | 2002/0015790 A1 | 2/2002 | Baum et al. |
| 6,905,541 | B2 | 6/2005 | Chen et al. | 2002/0016084 A1 | 2/2002 | Todd |
| 6,905,737 | B2 | 6/2005 | Verplancken et al. | 2002/0017242 A1 | 2/2002 | Hamaguchi et al. |
| 6,911,093 | B2 | 6/2005 | Stacey et al. | 2002/0020869 A1 | 2/2002 | Park et al. |
| 6,911,391 | B2 | 6/2005 | Yang et al. | 2002/0021544 A1 | 2/2002 | Cho et al. |
| 6,913,827 | B2 | 7/2005 | George et al. | 2002/0029092 A1 | 3/2002 | Gass |
| 6,915,592 | B2 | 7/2005 | Guenther | 2002/0031618 A1 | 3/2002 | Sherman |
| 6,916,398 | B2 | 7/2005 | Chen et al. | 2002/0041931 A1 | 4/2002 | Suntola et al. |
| 6,921,062 | B2 | 7/2005 | Gregg et al. | 2002/0043666 A1 | 4/2002 | Parsons et al. |
| 6,924,191 | B2 | 8/2005 | Liu et al. | 2002/0047151 A1 | 4/2002 | Kim et al. |
| 6,930,060 | B2 | 8/2005 | Chou et al. | 2002/0048635 A1 | 4/2002 | Kim et al. |
| 6,932,871 | B2 | 8/2005 | Chang et al. | 2002/0052097 A1 | 5/2002 | Park |
| 6,936,906 | B2 | 8/2005 | Chung et al. | 2002/0060363 A1 | 5/2002 | Xi et al. |
| 6,939,801 | B2 | 9/2005 | Chung et al. | 2002/0064970 A1 | 5/2002 | Chooi et al. |
| 6,946,033 | B2 | 9/2005 | Tsuei et al. | 2002/0066411 A1 | 6/2002 | Chiang et al. |
| 6,951,804 | B2 | 10/2005 | Seutter et al. | 2002/0068458 A1 | 6/2002 | Chiang et al. |
| 6,953,742 | B2 | 10/2005 | Chen et al. | 2002/0073924 A1 | 6/2002 | Chiang et al. |
| 6,955,211 | B2 | 10/2005 | Ku et al. | 2002/0074588 A1 | 6/2002 | Lee |
| 6,958,296 | B2 | 10/2005 | Chen et al. | 2002/0076481 A1 | 6/2002 | Chiang et al. |
| 6,969,539 | B2 | 11/2005 | Gordon et al. | 2002/0076507 A1 | 6/2002 | Chiang et al. |
| 6,972,267 | B2 | 12/2005 | Cao et al. | 2002/0076508 A1 | 6/2002 | Chiang et al. |
| 6,974,771 | B2 | 12/2005 | Chen et al. | 2002/0076837 A1 | 6/2002 | Hujanen et al. |
| 6,983,892 | B2 | 1/2006 | Noorbakhsh et al. | 2002/0081826 A1 | 6/2002 | Rotondaro et al. |
| 6,994,319 | B2 | 2/2006 | Yudovsky | 2002/0081844 A1 | 6/2002 | Jeon et al. |
| 6,998,014 | B2 | 2/2006 | Chen et al. | 2002/0086106 A1 | 7/2002 | Park et al. |
| 7,026,238 | B2 | 4/2006 | Xi et al. | 2002/0086111 A1 | 7/2002 | Byun et al. |
| 7,041,335 | B2 | 5/2006 | Chung | 2002/0086507 A1 | 7/2002 | Park et al. |
| 7,049,226 | B2 | 5/2006 | Chung et al. | 2002/0092471 A1 | 7/2002 | Kang et al. |
| 7,066,194 | B2 | 6/2006 | Ku et al. | 2002/0093046 A1 | 7/2002 | Moriya et al. |
| 7,067,439 | B2 | 6/2006 | Metzner et al. | 2002/0093781 A1 | 7/2002 | Bachhofer et al. |
| 7,081,271 | B2 | 7/2006 | Chung et al. | 2002/0094689 A1 | 7/2002 | Park |

| | | | | | | |
|---|---|---|---|---|---|---|
| 2002/0098627 A1 | 7/2002 | Pomarede et al. | | 2003/0101927 A1 | 6/2003 | Raaijmakers |
| 2002/0104481 A1 | 8/2002 | Chiang et al. | | 2003/0101938 A1 | 6/2003 | Ronsse et al. |
| 2002/0106451 A1 | 8/2002 | Skarp et al. | | 2003/0104707 A1 | 6/2003 | Senzaki et al. |
| 2002/0106536 A1 | 8/2002 | Lee et al. | | 2003/0104710 A1 | 6/2003 | Visokay et al. |
| 2002/0106846 A1 | 8/2002 | Seutter et al. | | 2003/0106490 A1 | 6/2003 | Jallepally et al. |
| 2002/0108570 A1 | 8/2002 | Lindfors | | 2003/0108674 A1 | 6/2003 | Chung et al. |
| 2002/0110991 A1 | 8/2002 | Li | | 2003/0109114 A1 | 6/2003 | Niwa |
| 2002/0115252 A1 | 8/2002 | Haukka et al. | | 2003/0113187 A1 | 6/2003 | Lei et al. |
| 2002/0115886 A1 | 8/2002 | Yasuhara et al. | | 2003/0116087 A1 | 6/2003 | Nguyen et al. |
| 2002/0117399 A1 | 8/2002 | Chen et al. | | 2003/0116804 A1 | 6/2003 | Visokay et al. |
| 2002/0121241 A1 | 9/2002 | Nguyen et al. | | 2003/0121469 A1 | 7/2003 | Lindfors et al. |
| 2002/0121342 A1 | 9/2002 | Nguyen et al. | | 2003/0121608 A1 | 7/2003 | Chen et al. |
| 2002/0127745 A1 | 9/2002 | Lu et al. | | 2003/0124262 A1 | 7/2003 | Chen et al. |
| 2002/0134307 A1 | 9/2002 | Choi | | 2003/0127427 A1 | 7/2003 | Yuan et al. |
| 2002/0135071 A1 | 9/2002 | Kang et al. | | 2003/0129826 A1 | 7/2003 | Werkhoven et al. |
| 2002/0144655 A1 | 10/2002 | Chiang et al. | | 2003/0133861 A1 | 7/2003 | Bowen et al. |
| 2002/0144657 A1 | 10/2002 | Chiang et al. | | 2003/0134508 A1 | 7/2003 | Raaijmakers et al. |
| 2002/0145210 A1 | 10/2002 | Tompkins et al. | | 2003/0139005 A1 | 7/2003 | Song et al. |
| 2002/0146511 A1 | 10/2002 | Chiang et al. | | 2003/0140854 A1 | 7/2003 | Kilpi |
| 2002/0146895 A1 | 10/2002 | Ramdani et al. | | 2003/0143328 A1 | 7/2003 | Chen et al. |
| 2002/0151152 A1 | 10/2002 | Shimamoto et al. | | 2003/0143747 A1 | 7/2003 | Bondestam et al. |
| 2002/0153579 A1 | 10/2002 | Yamamoto | | 2003/0143839 A1 | 7/2003 | Raaijmakers et al. |
| 2002/0155722 A1 | 10/2002 | Satta et al. | | 2003/0143841 A1 | 7/2003 | Yang et al. |
| 2002/0162506 A1 | 11/2002 | Sneh et al. | | 2003/0153177 A1 | 8/2003 | Tepman et al. |
| 2002/0164421 A1 | 11/2002 | Chiang et al. | | 2003/0160277 A1 | 8/2003 | Bhattacharyya |
| 2002/0164423 A1 | 11/2002 | Chiang et al. | | 2003/0165615 A1 | 9/2003 | Aaltonen et al. |
| 2002/0172768 A1 | 11/2002 | Endo et al. | | 2003/0166318 A1 | 9/2003 | Zheng et al. |
| 2002/0173130 A1 | 11/2002 | Pomerede et al. | | 2003/0167612 A1 | 9/2003 | Kraus et al. |
| 2002/0175393 A1 | 11/2002 | Baum et al. | | 2003/0168750 A1 | 9/2003 | Basceri et al. |
| 2002/0177282 A1 | 11/2002 | Song | | 2003/0172872 A1 | 9/2003 | Thakur et al. |
| 2002/0182320 A1 | 12/2002 | Leskela et al. | | 2003/0173586 A1 | 9/2003 | Moriwaki et al. |
| 2002/0187256 A1 | 12/2002 | Elers et al. | | 2003/0185980 A1 | 10/2003 | Endo |
| 2002/0187631 A1 | 12/2002 | Kim et al. | | 2003/0186495 A1 | 10/2003 | Saanila et al. |
| 2002/0195643 A1 | 12/2002 | Harada | | 2003/0186561 A1 | 10/2003 | Law et al. |
| 2002/0196591 A1 | 12/2002 | Hujanen et al. | | 2003/0188682 A1 | 10/2003 | Tois et al. |
| 2002/0197402 A1 | 12/2002 | Chiang et al. | | 2003/0189232 A1 | 10/2003 | Law et al. |
| 2002/0197856 A1 | 12/2002 | Matsuse et al. | | 2003/0190423 A1 | 10/2003 | Yang et al. |
| 2002/0197863 A1 | 12/2002 | Mak et al. | | 2003/0190497 A1 | 10/2003 | Yang et al. |
| 2002/0197881 A1 | 12/2002 | Ramdani et al. | | 2003/0190804 A1 | 10/2003 | Glenn et al. |
| 2002/0197883 A1 | 12/2002 | Niimi et al. | | 2003/0194493 A1 | 10/2003 | Chang et al. |
| 2003/0004723 A1 | 1/2003 | Chihara | | 2003/0194825 A1 | 10/2003 | Law et al. |
| 2003/0010451 A1 | 1/2003 | Tzu et al. | | 2003/0194853 A1 | 10/2003 | Jeon |
| 2003/0013300 A1 | 1/2003 | Byun | | 2003/0198740 A1 | 10/2003 | Wendling |
| 2003/0013320 A1 | 1/2003 | Kim et al. | | 2003/0198754 A1 | 10/2003 | Xi et al. |
| 2003/0015764 A1 | 1/2003 | Raaijmakers et al. | | 2003/0205729 A1 | 11/2003 | Basceri et al. |
| 2003/0017697 A1 | 1/2003 | Choi et al. | | 2003/0213560 A1* | 11/2003 | Wang et al. ............... 156/345.31 |
| 2003/0022338 A1 | 1/2003 | Ruben et al. | | 2003/0213987 A1 | 11/2003 | Basceri et al. |
| 2003/0022487 A1 | 1/2003 | Yoon et al. | | 2003/0215570 A1 | 11/2003 | Seutter et al. |
| 2003/0022507 A1 | 1/2003 | Chen et al. | | 2003/0216981 A1 | 11/2003 | Tillman |
| 2003/0023338 A1 | 1/2003 | Chin et al. | | 2003/0219942 A1 | 11/2003 | Choi et al. |
| 2003/0029715 A1 | 2/2003 | Yu et al. | | 2003/0221780 A1 | 12/2003 | Lei et al. |
| 2003/0031807 A1 | 2/2003 | Elers et al. | | 2003/0224107 A1 | 12/2003 | Lindfors et al. |
| 2003/0032281 A1 | 2/2003 | Werkhoven et al. | | 2003/0224578 A1 | 12/2003 | Chung et al. |
| 2003/0038369 A1 | 2/2003 | Layadi et al. | | 2003/0224600 A1 | 12/2003 | Cao et al. |
| 2003/0042630 A1 | 3/2003 | Babcoke et al. | | 2003/0227033 A1 | 12/2003 | Ahn et al. |
| 2003/0049931 A1 | 3/2003 | Byun et al. | | 2003/0232497 A1 | 12/2003 | Xi et al. |
| 2003/0049942 A1 | 3/2003 | Haukka et al. | | 2003/0232501 A1 | 12/2003 | Kher et al. |
| 2003/0053799 A1 | 3/2003 | Lei | | 2003/0232506 A1 | 12/2003 | Metzner et al. |
| 2003/0054631 A1 | 3/2003 | Raaijmakers et al. | | 2003/0232511 A1 | 12/2003 | Metzner et al. |
| 2003/0057526 A1 | 3/2003 | Chung et al. | | 2003/0232513 A1 | 12/2003 | Kraus et al. |
| 2003/0057527 A1 | 3/2003 | Chung et al. | | 2003/0232554 A1 | 12/2003 | Blum et al. |
| 2003/0059535 A1 | 3/2003 | Luo et al. | | 2003/0234417 A1 | 12/2003 | Raaijmakers et al. |
| 2003/0059538 A1 | 3/2003 | Chung et al. | | 2003/0235961 A1 | 12/2003 | Metzner et al. |
| 2003/0060057 A1 | 3/2003 | Raaijmakers et al. | | 2004/0005749 A1 | 1/2004 | Choi et al. |
| 2003/0068437 A1 | 4/2003 | Nakamura et al. | | 2004/0007747 A1 | 1/2004 | Visokay et al. |
| 2003/0072884 A1 | 4/2003 | Zhang et al. | | 2004/0009307 A1 | 1/2004 | Koh et al. |
| 2003/0072913 A1 | 4/2003 | Chou et al. | | 2004/0009336 A1 | 1/2004 | Marcadal et al. |
| 2003/0072975 A1 | 4/2003 | Shero et al. | | 2004/0009675 A1 | 1/2004 | Eissa et al. |
| 2003/0075273 A1 | 4/2003 | Kilpela et al. | | 2004/0011404 A1 | 1/2004 | Ku et al. |
| 2003/0075925 A1 | 4/2003 | Lindfors et al. | | 2004/0011504 A1 | 1/2004 | Ku et al. |
| 2003/0079686 A1* | 5/2003 | Chen et al. ............... 118/715 | | 2004/0013577 A1 | 1/2004 | Ganguli et al. |
| 2003/0082296 A1 | 5/2003 | Elers et al. | | 2004/0013803 A1 | 1/2004 | Chung et al. |
| 2003/0082300 A1 | 5/2003 | Todd et al. | | 2004/0014320 A1 | 1/2004 | Chen et al. |
| 2003/0082301 A1 | 5/2003 | Chen et al. | | 2004/0015300 A1 | 1/2004 | Ganguli et al. |
| 2003/0082307 A1 | 5/2003 | Chung et al. | | 2004/0016404 A1 | 1/2004 | Gregg et al. |
| 2003/0087520 A1 | 5/2003 | Chen et al. | | 2004/0016973 A1 | 1/2004 | Rotondaro et al. |
| 2003/0089308 A1 | 5/2003 | Raaijmakers | | 2004/0018304 A1 | 1/2004 | Chung et al. |
| 2003/0089942 A1 | 5/2003 | Bhattacharyya | | 2004/0018723 A1 | 1/2004 | Byun et al. |
| 2003/0096473 A1 | 5/2003 | Shih et al. | | 2004/0018738 A1 | 1/2004 | Liu |

| | | |
|---|---|---|
| 2004/0018747 A1 | 1/2004 | Lee et al. |
| 2004/0023461 A1 | 2/2004 | Ahn et al. |
| 2004/0023462 A1 | 2/2004 | Rotondaro et al. |
| 2004/0025370 A1 | 2/2004 | Guenther |
| 2004/0028952 A1 | 2/2004 | Cartier et al. |
| 2004/0029321 A1 | 2/2004 | Ang et al. |
| 2004/0033698 A1 | 2/2004 | Lee et al. |
| 2004/0036111 A1 | 2/2004 | Nishikawa et al. |
| 2004/0038486 A1 | 2/2004 | Chua et al. |
| 2004/0038554 A1 | 2/2004 | Ahn et al. |
| 2004/0040494 A1* | 3/2004 | Vaartstra et al. ............. 117/104 |
| 2004/0040501 A1 | 3/2004 | Vaartstra |
| 2004/0043149 A1 | 3/2004 | Gordon et al. |
| 2004/0043569 A1 | 3/2004 | Ahn et al. |
| 2004/0043623 A1 | 3/2004 | Liu et al. |
| 2004/0043630 A1 | 3/2004 | Vaartstra et al. |
| 2004/0046197 A1 | 3/2004 | Basceri et al. |
| 2004/0048461 A1 | 3/2004 | Chen et al. |
| 2004/0048491 A1 | 3/2004 | Jung et al. |
| 2004/0051152 A1 | 3/2004 | Nakajima |
| 2004/0053484 A1 | 3/2004 | Kumar et al. |
| 2004/0065255 A1 | 4/2004 | Yang et al. |
| 2004/0067641 A1 | 4/2004 | Yudovsky |
| 2004/0069227 A1 | 4/2004 | Ku et al. |
| 2004/0071897 A1 | 4/2004 | Verplancken et al. |
| 2004/0077182 A1 | 4/2004 | Lim et al. |
| 2004/0077183 A1 | 4/2004 | Chung |
| 2004/0105934 A1 | 6/2004 | Chang et al. |
| 2004/0143370 A1 | 7/2004 | Lu et al. |
| 2004/0144308 A1 | 7/2004 | Yudovsky |
| 2004/0144309 A1 | 7/2004 | Yudovsky |
| 2004/0144311 A1 | 7/2004 | Chen et al. |
| 2004/0144431 A1 | 7/2004 | Yudovsky |
| 2004/0157391 A1 | 8/2004 | Park et al. |
| 2004/0170403 A1 | 9/2004 | Lei |
| 2004/0175961 A1 | 9/2004 | Olsen |
| 2004/0187304 A1 | 9/2004 | Chen et al. |
| 2004/0194691 A1 | 10/2004 | George et al. |
| 2004/0197492 A1 | 10/2004 | Chen et al. |
| 2004/0198069 A1 | 10/2004 | Metzner et al. |
| 2004/0203254 A1 | 10/2004 | Conley et al. |
| 2004/0209460 A1 | 10/2004 | Xi et al. |
| 2004/0211665 A1 | 10/2004 | Yoon et al. |
| 2004/0214354 A1 | 10/2004 | Marsh et al. |
| 2004/0216670 A1 | 11/2004 | Gutsche et al. |
| 2004/0219784 A1 | 11/2004 | Kang et al. |
| 2004/0224089 A1 | 11/2004 | Singh et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0253375 A1 | 12/2004 | Ivanov et al. |
| 2004/0256351 A1 | 12/2004 | Chung et al. |
| 2004/0256664 A1 | 12/2004 | Chou et al. |
| 2004/0266175 A1 | 12/2004 | Chen et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0009371 A1 | 1/2005 | Metzner et al. |
| 2005/0012975 A1 | 1/2005 | George et al. |
| 2005/0022735 A1* | 2/2005 | Breitung et al. ............. 118/715 |
| 2005/0037627 A1 | 2/2005 | Dussarrat et al. |
| 2005/0056220 A1 | 3/2005 | Aoki et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0074968 A1 | 4/2005 | Chen et al. |
| 2005/0095859 A1 | 5/2005 | Chen et al. |
| 2005/0104142 A1 | 5/2005 | Narayanan et al. |
| 2005/0106865 A1 | 5/2005 | Chung et al. |
| 2005/0115675 A1 | 6/2005 | Tzu et al. |
| 2005/0118804 A1 | 6/2005 | Byun et al. |
| 2005/0130438 A1 | 6/2005 | Rotondaro et al. |
| 2005/0139160 A1 | 6/2005 | Lei et al. |
| 2005/0139948 A1 | 6/2005 | Chung et al. |
| 2005/0153571 A1 | 7/2005 | Senzaki |
| 2005/0164487 A1 | 7/2005 | Seutter et al. |
| 2005/0173068 A1 | 8/2005 | Chen et al. |
| 2005/0189072 A1 | 9/2005 | Chen et al. |
| 2005/0208217 A1 | 9/2005 | Shinriki et al. |
| 2005/0220998 A1 | 10/2005 | Chang et al. |
| 2005/0229969 A1 | 10/2005 | Nguyen et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0255690 A1 | 11/2005 | Chen et al. |
| 2005/0257735 A1 | 11/2005 | Guenther |
| 2005/0260347 A1 | 11/2005 | Narwankar et al. |
| 2005/0260357 A1 | 11/2005 | Olsen et al. |
| 2005/0266682 A1 | 12/2005 | Chen et al. |
| 2005/0271812 A1 | 12/2005 | Myo et al. |
| 2005/0271813 A1 | 12/2005 | Kher et al. |
| 2005/0271814 A1 | 12/2005 | Chang et al. |
| 2005/0277290 A1 | 12/2005 | Yang et al. |
| 2006/0018639 A1 | 1/2006 | Ramamurthy et al. |
| 2006/0019032 A1 | 1/2006 | Wang et al. |
| 2006/0019033 A1 | 1/2006 | Muthukrishnan et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0035025 A1 | 2/2006 | Verplancken et al. |
| 2006/0057843 A1 | 3/2006 | Chen et al. |
| 2006/0062917 A1 | 3/2006 | Muthukrishnan et al. |
| 2006/0075966 A1 | 4/2006 | Chen et al. |
| 2006/0084283 A1 | 4/2006 | Paranjpe et al. |
| 2006/0128150 A1 | 6/2006 | Gandikota et al. |
| 2006/0148253 A1 | 7/2006 | Chung et al. |
| 2006/0153973 A1 | 7/2006 | Chang et al. |
| 2006/0153995 A1 | 7/2006 | Narwankar et al. |
| 2006/0156979 A1 | 7/2006 | Thakur et al. |
| 2006/0178018 A1 | 8/2006 | Olsen |
| 2006/0199372 A1 | 9/2006 | Chung et al. |
| 2006/0208215 A1 | 9/2006 | Metzner et al. |
| 2006/0213557 A1 | 9/2006 | Ku et al. |
| 2006/0213558 A1 | 9/2006 | Ku et al. |
| 2006/0216928 A1 | 9/2006 | Chung et al. |
| 2006/0223286 A1 | 10/2006 | Chin et al. |
| 2006/0223339 A1 | 10/2006 | Metzner et al. |
| 2006/0257295 A1 | 11/2006 | Chen et al. |
| 2006/0264067 A1 | 11/2006 | Kher et al. |
| 2006/0276020 A1 | 12/2006 | Yoon et al. |
| 2006/0286774 A1 | 12/2006 | Singh et al. |
| 2006/0286775 A1 | 12/2006 | Singh et al. |
| 2006/0286776 A1 | 12/2006 | Ranish et al. |
| 2006/0286818 A1 | 12/2006 | Wang et al. |
| 2006/0286819 A1 | 12/2006 | Seutter et al. |
| 2006/0286820 A1 | 12/2006 | Singh et al. |
| 2006/0292864 A1 | 12/2006 | Yang et al. |
| 2007/0003698 A1 | 1/2007 | Chen et al. |
| 2007/0018244 A1 | 1/2007 | Hung et al. |
| 2007/0020890 A1 | 1/2007 | Thakur et al. |
| 2007/0026147 A1 | 2/2007 | Chen et al. |
| 2007/0044719 A1 | 3/2007 | Ku et al. |
| 2007/0049043 A1 | 3/2007 | Muthukrishnan et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0067609 A1 | 3/2007 | Chen et al. |
| 2007/0079759 A1 | 4/2007 | Lee et al. |
| 2007/0089817 A1 | 4/2007 | Ganguli et al. |
| 2007/0095285 A1 | 5/2007 | Thakur et al. |
| 2007/0099415 A1 | 5/2007 | Chen et al. |
| 2007/0110898 A1 | 5/2007 | Ganguli et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0151514 A1 | 7/2007 | Chen et al. |
| 2007/0235085 A1 | 10/2007 | Nakashima et al. |
| 2007/0252500 A1 | 11/2007 | Ranish et al. |
| 2008/0038463 A1 | 2/2008 | Chen et al. |
| 2008/0041307 A1 | 2/2008 | Nguyen et al. |
| 2008/0041313 A1 | 2/2008 | Chen et al. |
| 2008/0044569 A1 | 2/2008 | Myo et al. |
| 2008/0102203 A1 | 5/2008 | Wu et al. |
| 2008/0102208 A1 | 5/2008 | Wu et al. |

| | | | |
|---|---|---|---|
| 2008/0107809 A1 | 5/2008 | Wu et al. | |
| 2008/0268171 A1 | 10/2008 | Ma et al. | |
| 2008/0274299 A1 | 11/2008 | Chen et al. | |

FOREIGN PATENT DOCUMENTS

| | | |
|---|---|---|
| EP | 0497267 | 8/1992 |
| EP | 0973189 | 1/2000 |
| EP | 0973191 | 1/2000 |
| EP | 1146141 | 10/2001 |
| EP | 1167569 | 1/2002 |
| EP | 1170804 | 1/2002 |
| EP | 1321973 | 6/2003 |
| GB | 2355727 | 5/2001 |
| JP | 58098917 | 6/1983 |
| JP | 64082671 | 3/1989 |
| JP | 01143221 | 6/1989 |
| JP | 02014513 | 1/1990 |
| JP | 02230690 | 9/1990 |
| JP | 02246161 | 10/1990 |
| JP | 03234025 | 10/1991 |
| JP | 04291916 | 10/1992 |
| JP | 05029228 | 2/1993 |
| JP | 05047666 | 2/1993 |
| JP | 05074724 | 3/1993 |
| JP | 05206036 | 8/1993 |
| JP | 05234899 | 9/1993 |
| JP | 05251339 | 9/1993 |
| JP | 05270997 | 10/1993 |
| JP | 06177381 | 6/1994 |
| JP | 06196809 | 7/1994 |
| JP | 06224138 | 8/1994 |
| JP | 06230421 | 8/1994 |
| JP | 07086269 | 3/1995 |
| JP | 07300649 | 11/1995 |
| JP | 10308283 | 11/1998 |
| JP | 11-204517 A | 7/1999 |
| JP | 11269652 | 10/1999 |
| JP | 2000031387 | 1/2000 |
| JP | 2000058777 | 2/2000 |
| JP | 2000212752 | 8/2000 |
| JP | 2000319772 | 11/2000 |
| JP | 2001020075 | 1/2001 |
| JP | 2001111000 | 4/2001 |
| JP | 2001172767 | 6/2001 |
| JP | 2001220294 | 8/2001 |
| JP | 2001254181 | 9/2001 |
| JP | 2001328900 | 11/2001 |
| JP | 2002060944 | 2/2002 |
| JP | 2002069641 | 3/2002 |
| JP | 2002093804 | 3/2002 |
| JP | 2002167672 | 6/2002 |
| JP | 2002172767 | 6/2002 |
| JP | 2003-347297 A | 12/2003 |
| JP | 2004-071757 A | 3/2004 |
| JP | 2004-511909 T | 4/2004 |
| WO | WO-9617107 | 6/1996 |
| WO | WO-9901595 | 1/1999 |
| WO | WO-9919260 | 4/1999 |
| WO | WO-9929924 | 6/1999 |
| WO | WO-9965064 | 12/1999 |
| WO | WO-0013235 | 3/2000 |
| WO | WO-0015865 | 3/2000 |
| WO | WO-0016377 | 3/2000 |
| WO | WO-0054320 | 9/2000 |
| WO | WO-0063957 | 10/2000 |
| WO | WO-0070674 | 11/2000 |
| WO | WO-0079576 | 12/2000 |
| WO | WO-0115220 | 3/2001 |
| WO | WO-0117692 | 3/2001 |
| WO | WO-0125502 | 4/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 | 5/2001 |
| WO | WO-0140541 | 6/2001 |
| WO | WO-0166832 | 9/2001 |
| WO | WO-0182390 | 11/2001 |
| WO | WO-0199166 | 12/2001 |
| WO | WO-0201628 | 1/2002 |
| WO | WO-0208485 | 1/2002 |
| WO | WO-0208488 | 1/2002 |
| WO | WO-0209167 | 1/2002 |
| WO | WO-02/31875 A3 | 4/2002 |
| WO | WO-0227063 | 4/2002 |
| WO | WO-0231875 | 4/2002 |
| WO | WO-0243115 | 5/2002 |
| WO | WO-0245167 | 6/2002 |
| WO | WO-0245871 | 6/2002 |
| WO | WO-0246489 | 6/2002 |
| WO | WO-02065525 | 8/2002 |
| WO | WO-02067319 | 8/2002 |
| WO | WO-03023835 | 3/2003 |
| WO | WO-03/035927 A2 | 5/2003 |
| WO | WO-2004008491 | 1/2004 |
| WO | WO-2004010471 | 1/2004 |
| WO | WO-2004106584 | 12/2004 |

OTHER PUBLICATIONS

Balog, et al. "Chemical Vapor Deposition and Characterization of $HfO_2$ Films from Organo-Hafnium Compounds," Thin Solid Films, 41 (1977) 247-259.

Bedair "Atomic Layer Epitaxy Deposition Processes," J. Vac. Sci. Technol. B., vol. 12, No. 1, Jan./Feb. 1994.

Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," lnorg. Chem. 1999, 38, 2238-2239.

Choi, et al. "Stability of $TiB_2$ as a Diffusion Barrier on Silicon," J. Electrochem. Soc., vol. 138, No. 10, Oct. 1991 pp. 3062-3067.

Choi, et al. "The Effect of Annealing on Resistivity of Low Pressure Chemical Vapor Deposited Titanium Diboride," J. Appl. Phys. 69(11), Jun. 1, 1991 pp. 7853-7861.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, et al. "Interval Annealing During Alternating Pulse Deposition", Mat. Res. Soc. Symp. Proc. vol. 811, Apr. 12-16, 2004, D1.3.1.

Derbyshire "Applications of Integrated Processing," Solid State Technology, Dec. 1994 pp. 45-48.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Elers, et al. "$NbCl_5$ as a Precursor in Atomic Layer Epitaxy," Applied Surface Science 82/83 (1994) pp. 468-474.

European Office Action for PCT/US2005/016603 dated Jun. 3, 2008 for European Application No. 05 748 115.2-1215.

European Search Report dated Sep. 23, 2005 from European Application No. 03257169.7.

Ferguson, et al. "Atomic Layer Deposition of $Al_2O_3$ and $SiO_2$ on BN Particles Using Sequential Surface Reactions," Applied Surface Science, 162-163, (2000), pp. 280-292.

George, et al. "Atomic Layer Controlled Deposition of $SiO_2$ and $Al_2O_3$ using ABAB ... binary reaction sequence chemistry," Applied Surface Science 82/83 (1994) 460-467.

George, et al. "Surface Chemistry for Atomic Layer Growth," J. Phys. Chem. (1996), 100, 13121-13131.

Goswami, et al. 'Transition Metals Show Promise as Copper Barriers, Semiconductor International, ATMI, San Jose—May 1, 2004.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

Groner, et al. "High-k Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al. "Pulsed Deposition of Silicate Films," Journal of Applied Physics, vol. 94, No. 5, Sep. 1, 2003, pp. 3657-3659.

Hendrix, et al. "Composition Control of $Hf_{1-x}Si_xO_2$ Films Deposited on Si by Chemical-vapor Deposition Using Amide Precursors," Applied Physics Letters, American Institute of Physics, New York, US, vol. 80, No. 13, Apr. 1, 2002, pp. 2362-2364.

Ho, et al. "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

International Search Report and Written Opinion dated Sep. 12, 2008 for International Application No. PCT/US07/82369.

International Search Report for International Application No. PCT/US2005/016603 dated Sep. 15, 2005.

International Search Report for International Application No. PCT/US2005/016606 dated Aug. 22, 2005.

International Search Report for International Application No. PCT/US2005/016690 dated Aug. 22, 2005.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.

Jeong, et al. "Plasma-assisted Atomic Layer Growth of High-Quality Aluminum Oxide Thin Films," Jpn. J. Appl. Phys. 1, vol. 40, No. 1, Jan. 2001 pp. 285-289.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kang, et al. "Infrared Spectroscopic Study of Atomic Layer Deposition Mechanism for Hafnium Silicate Thin Films Using $HfCl2 [N(SiMe3) 2]2$ and $H2O$," J. Vac. Sci. Technol. A 22(6), Nov./Dec. 2004, American Vacuum Society, pp. 2393-2397.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and $NH_3$ radicals on properties of $HfAlO_x$ films prepared by atomic layer deposition", IWGI 2003, Tokyo, Nov. 6, 2003, pp. 32-37.

Kim, et al. "Substrate dependence on the optical properties of $Al_2O_3$ films grown by atomic layer deposition," Applied. Phys. Lett. 71 (25), Dec. 22, 1997 (3604-6).

Klaus, et al. "Atomic Layer Deposition of $SiO2$ Using Catalyzed and Uncatalyzed Self-Limiting Surface Reactions," Surface Review and Letters, vol. 6, Nos. 3 & 4 (1999) 435-448.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670-5.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al. "Properties of ${Nb_{1-x}Ta_x}_2O_5$ Solid Solutions and ${Nb_{1-x}Ta_x}_2O_5$-$ZrO_2$ Nanolaminates Grown by Atomic Layer Epitaxy," 1997; p. 785-93.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Lee, et al. "Cyclic Technique for the Enhancement of Highly Oriented Diamond Film Growth," Thin Solid Films 303 (1997) pp. 264-269.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition of Titanium-silicon-nitride Films," Applied Physics Letters, vol. 75, No. 11 (Sep. 11, 1999) pp. 1521-1523.

Niinisto, et al. "Synthesis of Oxide Thin Films and Overlayers by Atomic Layer Epitaxy for Advanced Applications," Materials Science and Engineering B41 (1996) 23-29.

Ohshita, et al. "Hf1-xSixO2 deposition by metal organic chemical vapor deposition using the $Hf(NEt2)4/SiH(NEt2)3/O2$ gas system", Preparation and Characterization, Elsevier Sequioa, NL, vol. 416, No. 1-2, Sep. 2, 2002, pp. 208-211.

Ohshita, et al. "$HfO_2$ Growth by Low-pressure Chemical Vapor Deposition Using the $Hf(N(C_2H_5)_2)_4/O_2$ Gas System," Journal of Crystal Growth 233 (2001) 292-297.

Paranjpe, et al. "Atomic Layer Deposition of AlO3 for Thin Film Head Gap Applications," J. Elec. Soc., vol. 148, No. 9 Sep. 2001 pp. G465-G471.

Park, et al. "Performance improvement of MOSFET with $HfO_2$-$Al_2O_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Partial International Search Report for International Application No. PCT/US2005/016694 dated Oct. 13, 2005.

Proceedings of the ICEEE 1998 International Interconnect Technology Conference—San Francisco, California, Jun. 1-3, 1998.

Ritala, et al. Ann. Acad. Sci. Fenn. Ser. A II. Chemica 257 (1994) 1-48.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Deposition of Oxide Thin Films with Metal Alkoxides as Oxygen Sources," Science vol. 288 Apr. 14, 2000 pp. 319-321.

Ritala, et al. "Atomic Layer Epitaxy Growth of TiN Thin Films From $TiI_4$ and $NH_3$," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Shenai, et al. "Correlation of vapor pressure equation and film properties with trimethylindium purity for the MOVPE grown III-V compounds," Journal of Crystal Growth 248 (2003) pp. 91-98.

Visokay, et al. "Application of HfSiON as a gate dielectric material", Applied Physics Letter, American Institute of Physics, New York, US, vol. 80, No. 17, Apr. 29, 2002, pp. 3183-3185.

Written Opinion of the International Search Report for International Application No. PCT/US2005/016603 dated Sep. 15, 2005.

Written Opinion of the International Search Report for International Application No. PCT/US2005/016606 dated Aug. 22, 2005.

Written Opinion of the International Search Report for International Application No. PCT/US2005/016690 dated Aug. 22, 2005.

Notification of First Office Action dated Feb. 20, 2009 for Chinese Patent Application No. 2005800084063.

Notice of Rejection dated Oct. 25, 2011 for Japanese Patent Application No. 2007-513372.

Notice of Rejection dated Apr. 10, 2012 for Korean Patent Application No. 10-2006-7026129.

\* cited by examiner

METHODS FOR ATOMIC LAYER DEPOSITION OF HAFNIUM-CONTAINING HIGH-K DIELECTRIC MATERIALS

CROSS-REFERENCE TO RELATED APPLICATIONS

This application is a divisional application of U.S. Ser. No. 11/127,753, filed May 12, 2005, which claims benefit of U.S. Ser. No. 60/570,173, filed May 12, 2004, which are herein incorporated by reference in their entirety.

BACKGROUND OF THE INVENTION

1. Field of the Invention

Embodiments of the invention generally relate to methods and apparatuses for depositing materials on a substrate, and more specifically, to methods and apparatuses for depositing high-k dielectric materials by vapor deposition processes.

2. Description of the Related Art

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater are being considered. Accordingly, conformal deposition of materials to form these devices is becoming increasingly important.

While conventional chemical vapor deposition (CVD) has proved successful for device geometries and aspect ratios down to 0.15 µm, the more aggressive device geometries require an alternative deposition technique. One technique that is receiving considerable attention is atomic layer deposition (ALD). During an ALD process, reactant gases are sequentially introduced into a process chamber containing a substrate. Generally, a first reactant is pulsed into the process chamber and is adsorbed onto the substrate surface. A second reactant is pulsed into the process chamber and reacts with the first reactant to form a deposited material. A purge step is typically carried out between the delivery of each reactant gas. The purge step may be a continuous purge with the carrier gas or a pulse purge between the delivery of the reactant gases.

The formation of high-k dielectric materials by oxidizing metal and silicon precursors during an ALD process is known in the art. Ozone or atomic oxygen is a common oxidant or oxidizing source for ALD processes. A low process temperature may be advantageously maintained during the deposition process while forming the dielectric material due to the radical state of ozone and atomic oxygen. While the high reactivity at low temperature is an attribute of the radical oxidizing agents, undesirable side reactions are prevalent throughout the process chamber forming contaminants on the substrate. Alternatively, water or oxygen may be used as an oxidizing source to form dielectric materials during an ALD process. However, due to the moderate reactivity of water or oxygen, ALD processes generally require slower flow rates, longer exposure periods and higher temperatures than radical oxygen sources. Also, ALD processes that use water or oxygen require an extended purge period after each oxidizing pulse and therefore increase fabrication throughput. Furthermore, the slow flow rates and high temperatures usually increase contaminants on the substrate surface.

Steam oxidation processes have been used to passivate or oxidize metal or silicon materials during conventional CVD processes. In one example, water vapor is plumbed into the process chamber after being generated by boiling water contained within a secondary container. In another example, hydrogen gas and oxygen gas are fed into a process chamber preheated at a high temperature (e.g., >1,000° C.). In both examples, the generated water vapor reacts with a metal surface or a silicon surface to form dielectric materials, such as metal oxides or silicon oxides. While the aforementioned steam oxidation processes may produce an effective water vapor for use during a CVD process, the generated water vapor is not acceptable for use during an ALD process. Water vapor derived from these steam oxidation processes may cause contaminants on the substrate surface and modest control over process temperature or the contents of the oxidizing water vapor. Also, ALD processes require immediate access to reagents of a consistent composition that may be quantitatively delivered into the process chamber.

Therefore, there is a need for an apparatus and a process for depositing a dielectric material that generates an oxidizing gas at low temperatures, controls the composition of the oxidizing gas and the deposited dielectric materials, shortens process periods and minimizes contaminants.

SUMMARY OF THE INVENTION

In one embodiment, an apparatus for processing substrates is provided which includes a substrate support having a substrate receiving surface and a chamber lid containing an expanding channel formed within a thermally insulating material at a central portion of the chamber lid. A tapered bottom surface extends from the expanding channel to a peripheral portion of the chamber lid and is shaped and sized to substantially cover the substrate receiving surface. The apparatus further includes a first conduit and a second conduit coupled to a first gas inlet and a second gas inlet within the expanding channel. The first and second conduits are positioned to provide a gas flow through the expanding channel in a circular direction, such that the gas flow has a flow pattern of a vortex, a helix, a spiral or derivative thereof. The expanding channel may be formed directly within the chamber lid or formed within a funnel liner attached thereon. The chamber may contain additional thermally insulating liners that include an upper process liner, a lower process liner, a retaining ring liner or a slip valve liner. Chamber liners usually contain thermally insulating materials that include fused quartz, ceramic, sapphire, derivatives thereof or combinations thereof and may have a surface finish of at least about 0.051 µm.

In another example, an apparatus for processing substrates is provided which includes a substrate support having a substrate receiving surface and a chamber lid containing an expanding channel formed within a thermally insulating material at a central portion of the chamber lid. A tapered bottom surface extends from the expanding channel to a peripheral portion of the chamber lid and is shaped and sized to substantially cover the substrate receiving surface. The apparatus further contains at least one conduit coupled to at least one gas inlet within the expanding channel, an ALD valve assembly coupled to the conduit and a water vapor generator coupled to the ALD valve assembly. The water vapor generator contains a catalyst and is in fluid communication with the expanding channel through the ALD valve assembly. A hydrogen source and an oxygen source are usually plumbed to the water vapor generator.

In another embodiment, an apparatus for depositing an oxygen containing material by an ALD process is provided which includes an ALD process chamber containing a substrate support exposed to a process region and at least two ALD valve assemblies in fluid communication with the process region. The chamber may have a lid assembly containing an expanding channel at a central portion of the lid assembly further defining the process region. The apparatus further provides a first precursor source coupled to one ALD valve assembly and a water vapor generator coupled to a second ALD valve assembly. The water vapor generator is connected to a hydrogen source and an oxygen source and produces a water vapor with a flow rate in a range from about 0.1 standard cubic centimeters per minute (sccm) to about 100 sccm. In one example, the water vapor has a flow rate of about 10 sccm or less, preferably about 1 sccm or less. A hydrogen source gas and an oxygen source gas may be diluted by a carrier gas, such that in one example, a hydrogen source gas contains about 5 vol % of hydrogen within a nitrogen carrier gas. The water vapor generator may have a catalyst that contains palladium, platinum, nickel, iron, chromium, ruthenium, rhodium, alloys thereof or combinations thereof.

In one embodiment, a method for depositing a material on a substrate is provided which includes positioning the substrate on a substrate support within a process chamber that includes a chamber body and a chamber lid. The chamber lid contains an expanding channel formed from a thermally insulating material at a central portion of the chamber lid and a tapered bottom surface extending from the expanding channel to a peripheral portion of the chamber lid. The tapered bottom surface is shaped and sized to substantially cover the substrate. The process chamber further contains a first conduit and a second conduit coupled to a first gas inlet and a second gas inlet within the expanding channel. The first and second conduits are positioned to provide a gas with a circular flow. The method further provides flowing at least one carrier gas through the first and second conduits to form the circular flow, exposing the substrate to the at least one carrier gas with the circular flow, pulsing at least one precursor into the at least one carrier gas and depositing a material containing at least one element from the at least one precursor onto the substrate. The carrier gas may have a circular flow with a flow pattern of a vortex, a helix, a spiral or derivative thereof.

In another embodiment, a method for depositing a material on a substrate is provided which includes positioning a substrate on a substrate support within a process chamber containing a gas delivery system capable of forming a gas with a circular flow, flowing at least one carrier gas into the process chamber to form the circular flow and exposing the substrate to the at least one carrier gas with the circular flow. The method further provides flowing a hydrogen source gas and an oxygen source gas into a water vapor generator to form a water vapor and sequentially pulsing at least one precursor and the water vapor into the carrier gas to deposit a material containing oxygen and at least one element from the precursor onto the substrate.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION

The invention provides methods for depositing hafnium-containing materials and other high-k dielectric materials on substrate surfaces by atomic layer deposition (ALD) processes. In one aspect, an ALD process is conducted by sequentially pulsing a hafnium precursor and an oxidizing gas into an ALD process chamber to form a hafnium-containing material. The oxidizing gas contains water vapor derived from a water vapor generator (WVG) system coupled to the ALD process chamber. The WVG system generates the oxidizing gas at low temperatures (e.g., <500° C.) by exposing a hydrogen source gas and an oxygen source gas to a catalyst. The composition of the oxidizing gas may be precisely controlled to provide water vapor enriched in various ratios of oxygen or hydrogen. The ALD processes utilizing the WVG system to produce water vapor have elemental control of the composition of the deposited dielectric materials, minimized contaminants on the substrate and rapid process times that increase fabrication throughput.

Process

Figure 1:
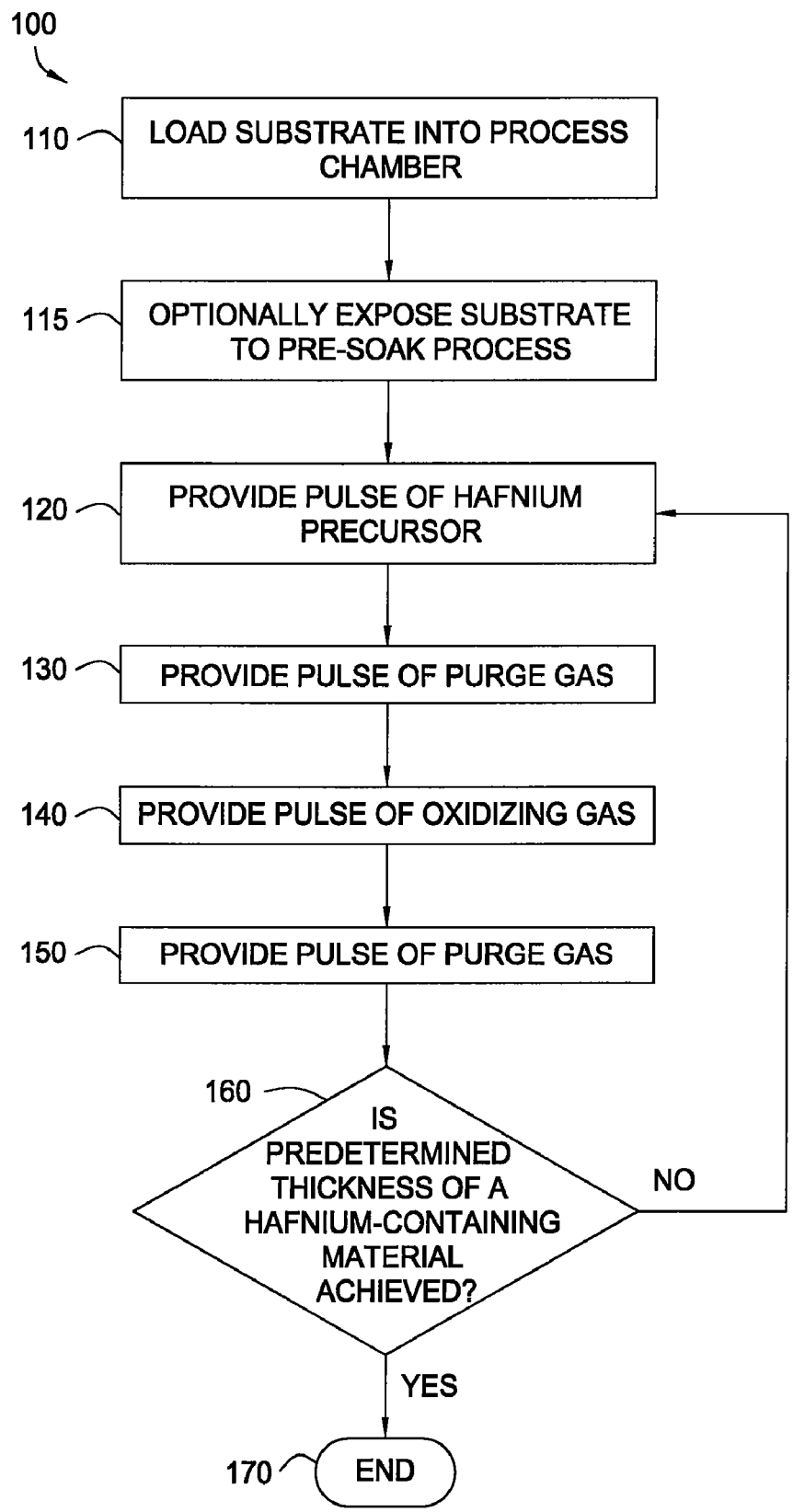
FIG. 1 shows a process sequence for depositing a hafnium-containing material by an ALD process according to an embodiment described herein.

FIG. 1 illustrates an exemplary process sequence 100 for forming a hafnium-containing material, such as hafnium oxide, according to one embodiment of the invention. A substrate is loaded into a process chamber capable of performing cyclical deposition and the process conditions are adjusted (step 110). Process conditions may include temperature of the substrate or the process chamber, chamber pressure and gas flow rates. The substrate may be exposed to an optional presoak process and purge prior to starting an ALD cycle (step 115). The substrate is exposed to a pulse of a hafnium precursor introduced into the process chamber alone or in combinations with a carrier gas for a time period in a range from about 0.1 seconds to about 5 seconds (step 120). A pulse of purge gas is then introduced into the processing chamber (step 130) to purge or otherwise remove any residual hafnium precursor or by-products. Next, a pulse of oxidizing gas is introduced into the processing chamber (step 140). The oxidizing gas may include a mixture of several oxidizing agents, such as water vapor and oxygen. A pulse of purge gas is again introduced into the process chamber (step 150) to purge or otherwise remove any residual oxidizing gas or by-products. Suitable carrier gases or purge gases may include helium, argon, nitrogen, hydrogen, forming gas, oxygen or combinations thereof.

A "pulse" as used herein is intended to refer to a quantity of a particular compound that is intermittently or non-continuously introduced into a reaction zone of a process chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto and the volatility/reactivity of the particular compound. A "half-reaction" as used herein refers to an exposing step followed by a removing step. The exposing step provides introducing a reagent into the process chamber and adsorbing or chemically reacting the reagent on a substrate contained therein, such as a pulse of process gas containing the reagent. The purge step provides removing excess reagent or reaction by-products from the chamber introducing a gas (e.g., purge gas or carrier gas), evacuating with a vacuum system or combinations thereof.

Referring to step 160, after each deposition cycle (steps 120 through 150), a layer of a hafnium-containing material, such as hafnium oxide, is deposited on the substrate. Usually, each deposition cycle forms a layer with a thickness in the range from about 1 Å to about 10 Å. Depending on specific device requirements, subsequent deposition cycles may be needed to deposit hafnium-containing material having a desired thickness. As such, a deposition cycle (steps 120 through 150) may be repeated to achieve the predetermined thickness of the hafnium-containing material. Thereafter, process sequence 100 may be stopped as indicated at step 170. The hafnium oxide material formed by the deposition process has the empirical chemical formula $HfO_x$. Hafnium oxide may have the molecular chemical formula $HfO_2$, but by varying process conditions (e.g., timing, temperature or precursors), hafnium oxides may be less oxidized, such as $HfO_{1.8}$. Preferably, hafnium oxide is deposited by the processes herein with the molecular chemical formula is $HfO_2$ or the oxygen:hafnium concentration is less than 2.

A substrate may be exposed to a pretreatment process or a pre-soak process in order to terminate the substrate surface with a variety of functional groups, as depicted during step 115. Functional groups useful before starting a deposition process as described herein include hydroxyls (OH), alkoxy (OR, where R=Me, Et, Pr or Bu), haloxyls (OX, where X=F, Cl, Br or I), halides (F, Cl, Br or I), oxygen radicals and aminos (NR or $NR_2$, where R=H, Me, Et, Pr or Bu). The pretreatment process may expose the substrate to a reagent, such as $NH_3$, $B_2H_6$, $SiH_4$, $SiH_6$, $H_2O$, HF, HCl, $O_2$, $O_3$, $H_2O$, $H_2O_2$, $H_2$, atomic-H, atomic-N, atomic-O, alcohols, amines, derivatives thereof or combination thereof. The functional groups may provide a base for an incoming chemical precursor to attach on the substrate surface. The pretreatment process may expose the substrate surface to the reagent for a period in a range from about 1 second to about 2 minutes, preferably from about 5 seconds to about 60 seconds.

In one embodiment, a pre-soak process may include optionally exposing the substrate to the oxidizing gas containing water vapor generated from the WVG system. The pre-soak process provides the substrate surface with hydroxyl terminated functional groups that react with precursors containing amino-type ligands (e.g., TDEAH, TDMAH, TDMAS or Tris-DMAS) during a subsequent exposure. During a pre-soak process, the substrate surface may be exposed to the oxidizing gas containing water vapor for a time period in a range from about 3 seconds to about 90 seconds, preferably from about 5 seconds to about 60 seconds, and more preferably, from about 10 seconds to about 30 seconds. After the soak process, the process chamber is usually purged with a carrier gas or a purge gas to remove excess oxidizing gas and any volatile by-products therein. In an example of forming a hafnium-containing material, the substrate surface may be exposed for about 9 seconds to an oxidizing gas containing water vapor generated from the WVG system. Thereafter, the process chamber is purged for about 6 seconds and an ALD process cycle is initiated by providing a pulse of a process gas containing TDEAH or TDMAH. In other examples, such as for forming silicon-containing materials, the substrate surface may be exposed for about 15 seconds to an oxidizing gas containing water vapor generated from the WVG system. Thereafter, the process chamber is purged for about 10 seconds and an ALD process cycle is initiated by providing a pulse of a process gas containing TDMAS or Tris-DMAS.

The ALD process is typically conducted in a process chamber at a pressure in the range from about 1 Torr to about 100 Torr, preferably from about 1 Torr to about 20 Torr, and more preferably in a range from about 1 Torr to about 10 Torr. The temperature of the substrate is usually maintained in the range from about 70° C. to about 1,000° C., preferably from about 100° C. to about 650° C., and more preferably from about 250° C. to about 500° C.

During step 120, the hafnium precursor is introduced into the process chamber at a rate in the range from about 5 standard cubic centimeters per minute (sccm) to about 200 sccm. The hafnium precursor is usually introduced with a carrier gas, such as nitrogen, with a total flow rate in the range from about 50 sccm to about 1,000 sccm. The hafnium precursor may be pulsed into the process chamber at a rate in a range from about 0.1 seconds to about 10 seconds, depending on the particular process conditions, hafnium precursor or desired composition of the deposited hafnium-containing material. In one embodiment, the hafnium precursor is pulsed into the process chamber at a rate in a range from about 1 second to about 5 seconds, for example, about 3 seconds. In another embodiment, the hafnium precursor is pulsed into the process chamber at a rate in a range from about 0.1 seconds to about 1 second, for example, about 0.5 seconds. In one example, the hafnium precursor is preferably hafnium tetrachloride ($HfCl_4$). In another example, the hafnium precursor is preferably a tetrakis(dialkylamino)hafnium compound, such as tetrakis(diethylamino)hafnium (($Et_2N)_4Hf$ or TDEAH).

Figure 2A:
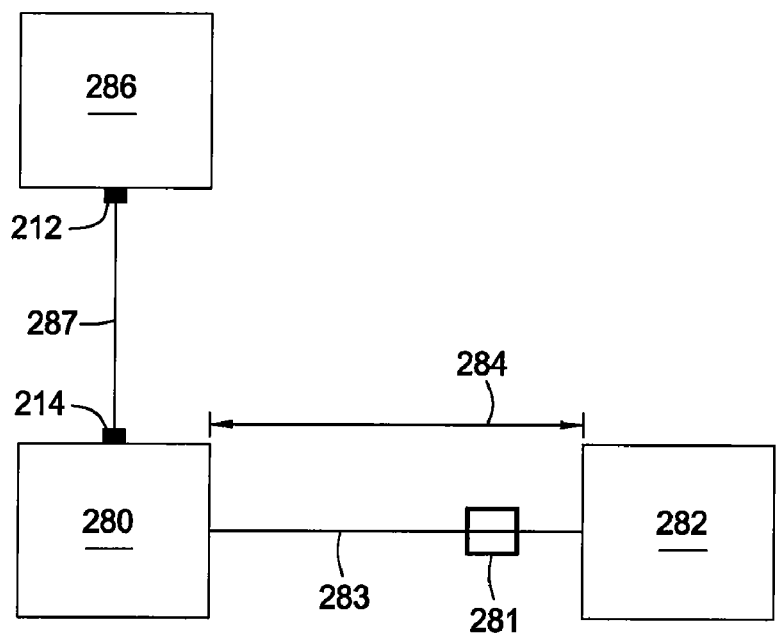
FIG. 2A depicts a schematic view of a process system configured according to an embodiment described herein.

The hafnium precursor is generally dispensed into process chamber 280 by introducing a carrier gas through ampoule 282 containing the hafnium precursor, as depicted in FIG. 2A. Ampoule 282 may include an ampoule, a bubble, a cartridge or other container used for containing or dispersing chemical precursors. A suitable ampoule, such as the PROE-VAP™, is available from Advanced Technology Materials, Inc., located in Danbury, Conn. Ampoule 282 is in fluid communication with process chamber 280 by conduit 283. Conduit 283 may be a tube, a pipe, a line, a hose or other conduits known in the art. Also, ampoule 282 is at distance 284 from process chamber 280. Distance 284 is usually less than about 2 meters preferably, less than about 1.25 meters, and more preferably about 0.7 meters or less. Distance 284 may be minimized in order to maintain consistent hafnium precursor flow. Also, while conduit 283 may be straight or have bends, conduit 283 is preferably straight or has as few bends as possible. Conduit 283 may be wrapped with a heating tape to maintain a predetermined temperature. The temperature of ampoule 282 is maintained at a temperature depending on the hafnium precursor within, such as in a range from about 20° C. to about 300° C. In one example, ampoule 282 contains $HfCl_4$ at a temperature in a range from about 150° C. to about 200° C.

In one embodiment, ampoule 282 may be part of a liquid delivery system containing injector valve system 281. Injector valve system 281 is connected to ampoule 282 and process chamber 280 by conduit 283. A source of carrier gas is usually connected to injected valve system 281 (not shown). Ampoule 282 containing a liquid precursor (e.g., TDEAH, TDMAH, TDMAS or Tris-DMAS) may be pressurized to transfer the liquid precursor to injector valve system 281. Generally, ampoule 282 containing a liquid precursor may be pressurized at a pressure in a range from about 138 kPa (about 20 psi) to about 414 kPa (about 60 psi) and may be heated to a temperature of about 100° C. or less, preferably in a range from about 20° C. to about 60° C. Injector valve system 281 combines the liquid precursor with a carrier gas to form a precursor vapor that is injected into process chamber 280. A carrier gas may include nitrogen, argon, helium, hydrogen or combinations thereof and the carrier may be pre-heated to a temperature in a range from about 85° C. to about 150° C. A suitable injector valve is available from Horiba-Stec, located in Kyoto, Japan.

During step 140, the oxidizing gas is introduced to process chamber 280 with a flow a rate in the range from about 0.05 sccm to about 1,000 sccm, preferably in the range from about 0.5 sccm to about 100 sccm. The oxidizing gas is pulsed into process chamber 280 at a rate in a range from about 0.05 seconds to about 10 seconds, preferably, from about 0.08 seconds to about 3 seconds, and more preferably, from about 0.1 seconds to about 2 seconds. In one embodiment, the oxidizing gas is pulsed at a rate in a range from about 1 second to about 5 seconds, for example, about 1.7 seconds. In another embodiment, the oxidizing gas is pulsed at a rate in a range from about 0.1 seconds to about 3 seconds, for example, about 0.5 seconds.

The oxidizing gas may be produced from water vapor generator (WVG) system 286 in fluid communication with process chamber 280 by conduit 287. Fittings 212 and 214 may be used to link conduit 287 to WVG system 286 or to process chamber 280. Suitable fittings include UPG fittings available from Fujikin of America, Inc. Generally, conduit 287 is in fluid communication with process chamber 280 through an ALD valve assembly. Conduit 287 may be a tube, a pipe, a line or a hose composed of a metal (e.g., stainless steel or aluminum), rubber or plastic (e.g., PTFE). In one example, a pipe formed from stainless steel 316L is used as conduit 287. The WVG system 286 generates ultra-high purity water vapor by means of a catalytic reaction of an oxygen source gas (e.g., $O_2$) and a hydrogen source gas (e.g., $H_2$) at a low temperature (e.g., <500° C.). The hydrogen and oxygen source gases each flow into WVG system 286 at a flow rate in the range from about 5 sccm to about 200 sccm, preferably, from about 10 sccm to about 100 sccm. Generally, the flow rates of the oxygen and hydrogen source gases are independently adjusted to have a presence of oxygen or an oxygen source gas and an absence of the hydrogen or hydrogen source gas within the outflow of the oxidizing gas.

An oxygen source gas useful to generate an oxidizing gas containing water vapor may include oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof or combinations thereof. A hydrogen source gas useful to generate an oxidizing gas containing water vapor may include hydrogen ($H_2$), atomic hydrogen (H), forming gas ($N_2/H_2$), ammonia ($NH_3$), hydrocarbons (e.g., $CH_4$), alcohols (e.g., $CH_3OH$), derivatives thereof or combinations thereof. A carrier gas may be co-flowed with either the oxygen source gas or the hydrogen source gas and may include $N_2$, He, Ar or combinations thereof. Preferably, the oxygen source gas is oxygen or nitrous oxide and the hydrogen source gas is hydrogen or a forming gas, such as 5 vol % of hydrogen in nitrogen.

A hydrogen source gas and an oxygen source gas may be diluted with a carrier gas to provide sensitive control of the water vapor within the oxidizing gas during deposition processes. In one embodiment, a slower water vapor flow rate (about <10 sccm water vapor) may be desirable to complete the chemical reaction during an ALD process to form a hafnium-containing material or other dielectric materials. A slower water vapor flow rate dilutes the water vapor concentration within the oxidizing gas. The diluted water vapor is at a concentration to oxidize adsorbed precursors on the substrate surface. Therefore, a slower water vapor flow rate minimizes the purge time after the water vapor exposure to increase the fabrication throughput. Also, the slower water vapor flow rate reduces formation of particulate contaminants by avoiding undesired co-reactions. A mass flow controller (MFC) may be used to control a hydrogen source gas with a flow rate of about 0.5 sccm while producing a stream of water vapor with a flow rate of about 0.5 sccm. However, most MFC systems are unable to provide a consistent flow rate at such a slow rate. Therefore, a diluted hydrogen source gas (e.g., forming gas) may be used in a WVG system to achieve a slower water vapor flow rate. In one example, a hydrogen source gas with a flow rate of about 10 sccm and containing 5% hydrogen forming gas deliveries water vapor from a WVG system with a flow rate of about 0.5 sccm. In an alternative embodiment, a faster water vapor flow rate (about >10 sccm water vapor) may be desirable to complete the chemical reaction during an ALD process while forming a hafnium-containing material or other dielectric materials. For example, about 100 sccm of hydrogen gas deliveries about 100 sccm of water vapor.

The forming gas may be selected with a hydrogen concentration in a range from about 1% to about 95% by volume in a carrier gas, such as argon or nitrogen. In one aspect, a hydrogen concentration of a forming gas is in a range from about 1% to about 30% by volume in a carrier gas, preferably from about 2% to about 20%, and more preferably, from about 3% to about 10%, for example, a forming gas may contain about 5% hydrogen and about 95% nitrogen. In another aspect, a hydrogen concentration of a forming gas is in a range from about 30% to about 95% by volume in a carrier gas, preferably from about 40% to about 90%, and more preferably from about 50% to about 85%, for example, a forming gas may contain about 80% hydrogen and about 20% nitrogen.

In one example, a WVG system receives a hydrogen source gas containing 5% hydrogen (95% nitrogen) with a flow rate of about 10 sccm and an oxygen source gas (e.g., $O_2$) with a flow rate of about 10 sccm to form an oxidizing gas containing water vapor with a flow rate of about 0.5 sccm and oxygen with a flow rate of about 9.8 sccm. In another example, a WVG system receives a hydrogen source gas containing 5% hydrogen forming gas with a flow rate of about 20 sccm and an oxygen source gas with a flow rate of about 10 sccm to form an oxidizing gas containing water vapor with a flow rate of about 1 sccm and oxygen with a flow rate of about 9 sccm. In another example, a WVG system receives a hydrogen source gas containing hydrogen gas with a flow rate of about 20 sccm and an oxygen source gas with a flow rate of about 10 sccm to form an oxidizing gas containing water vapor at a rate of about 10 sccm and oxygen at a rate of about 9.8 sccm. In other examples, nitrous oxide, as an oxygen source gas, is used with a hydrogen source gas to form a water vapor during ALD processes. Generally, 2 molar equivalents of nitrous oxide are substituted for each molar equivalent of oxygen gas.

A WVG system contains a catalyst, such as catalyst-lined reactor or a catalyst cartridge, in which the oxidizing gas containing water vapor is generated by a catalytic chemical reaction between a source of hydrogen and a source of oxygen. A WVG system is unlike pyrogenic generators that produce water vapor as a result of an ignition reaction, usually at temperatures over 1,000° C. A WVG system containing a catalyst usually produces water vapor at a low temperature in the range from about 100° C. to about 500° C., preferably at about 350° C. or less. The catalyst contained within a catalyst reactor may include a metal or alloy, such as palladium, platinum, nickel, iron, chromium, ruthenium, rhodium, alloys thereof or combinations thereof. The ultra-high purity water is ideal for the ALD processes in the present invention. In one embodiment, to prevent unreacted hydrogen from flowing downstream, an oxygen source gas is allowed to flow through the WVG system for about 5 seconds. Next, the hydrogen source gas is allowed to enter the reactor for about 5 seconds. The catalytic reaction between the oxygen and hydrogen source gases (e.g., $H_2$ and $O_2$) generates a water vapor. Regulating the flow of the oxygen and hydrogen source gases allows precise control of oxygen and hydrogen concentrations within the formed oxidizing gas containing water vapor. The water vapor may contain remnants of the hydrogen source gas, the oxygen source gas or combinations thereof. Suitable WVG systems are commercially available, such as the Water Vapor Generator (WVG) system by Fujikin of America, Inc., located in Santa Clara, Calif. and or the Catalyst Steam Generator System (CSGS) by Ultra Clean Technology, located in Menlo Park, Calif.

Figure 2B:
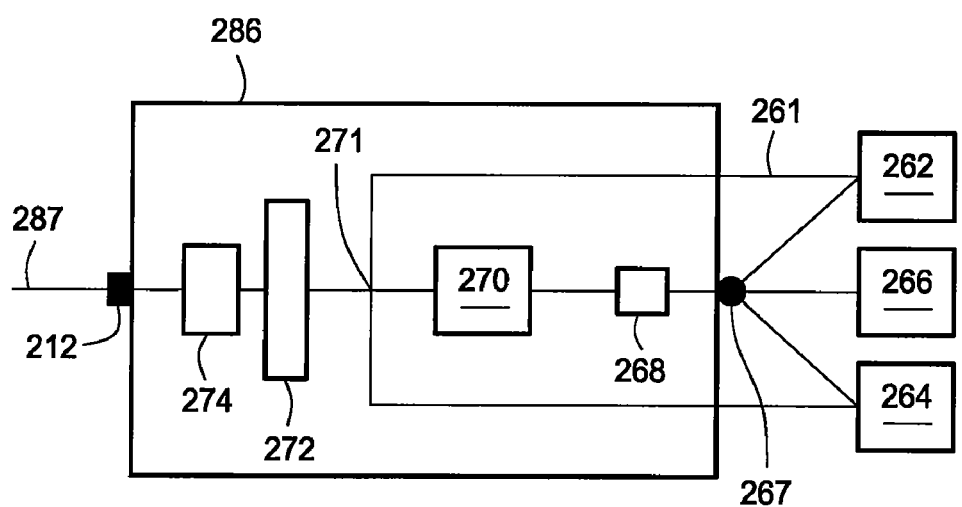
FIG. 2B depicts a schematic view of a water vapor generator system according to an embodiment described herein.

FIG. 2B illustrates one configuration of WVG system 286. Hydrogen source 262, oxygen source 264 and carrier gas source 266 are connected to WVG system 286 by conduit system 261. Conduit system 261 contains conduits and valves that allow gases from hydrogen source 262, oxygen source 264 and/or carrier gas source 266 to be independently in fluid communication with catalyst reactor 270 through gas inputs 267 and gas filter 268. Water vapor is formed within and emitted from catalyst reactor 270. Also, conduit system 261 contains conduits and valves that allow gases from hydrogen source 262 and oxygen source 264 to independently bypass catalyst reactor 270 at junction 271. Therefore, additional hydrogen source gas and/or oxygen source gas may bypass catalyst reactor 270 and combine with water vapor to form an oxidizing gas enriched with oxygen or hydrogen. Gas sensor 272 and gas filter 274 are connected to conduit system 261 downstream from catalyst reactor 270. Gas sensor 272 may be used to determine the composition of the oxidizing gas including oxygen, hydrogen and water concentrations. The oxidizing gas may pass through gas filter 274 prior to exiting WVG system 286.

The pulses of a purge gas, preferably argon or nitrogen, at steps 130 and 150, are typically introduced at a flow rate in a range from about 2 standard liters per minute (slm) to about 22 slm, preferably about 10 slm. Each processing cycle (steps 120 through 150) occurs for a time period in a range from about 0.01 seconds to about 20 seconds. In one example, the process cycle lasts about 10 seconds. In another example, the process cycle lasts about 2 seconds. Longer processing steps lasting about 10 seconds deposit excellent hafnium-containing films, but reduce the throughput. The specific purge gas flow rates and duration of process cycles are obtained through experimentation. In one example, a 300 mm diameter wafer requires about twice the flow rate for the same duration as a 200 mm diameter wafer in order to maintain similar throughput.

In one embodiment, hydrogen gas is applied as a carrier gas, purge and/or a reactant gas to reduce halogen contamination from the deposited materials. Precursors that contain halogen atoms (e.g., $HfCl_4$, $SiCl_4$ and $Si_2Cl_6$) readily contaminate the deposited dielectric materials. Hydrogen is a reductant and will produce hydrogen halides (e.g., HCl) as a volatile and removable by-product. Therefore, hydrogen may be used as a carrier gas or reactant gas when combined with a precursor compound (e.g., hafnium, silicon, oxygen precursors) and may include another carrier gas (e.g., Ar or $N_2$). In one example, a water/hydrogen mixture, at a temperature in the range from about 100° C. to about 500° C., is used to reduce the halogen concentration and increase the oxygen concentration of the deposited material. In one example, a water/hydrogen mixture may be derived by feeding an excess of hydrogen source gas into a WVG system to form a hydrogen enriched water vapor.

Figure 3:
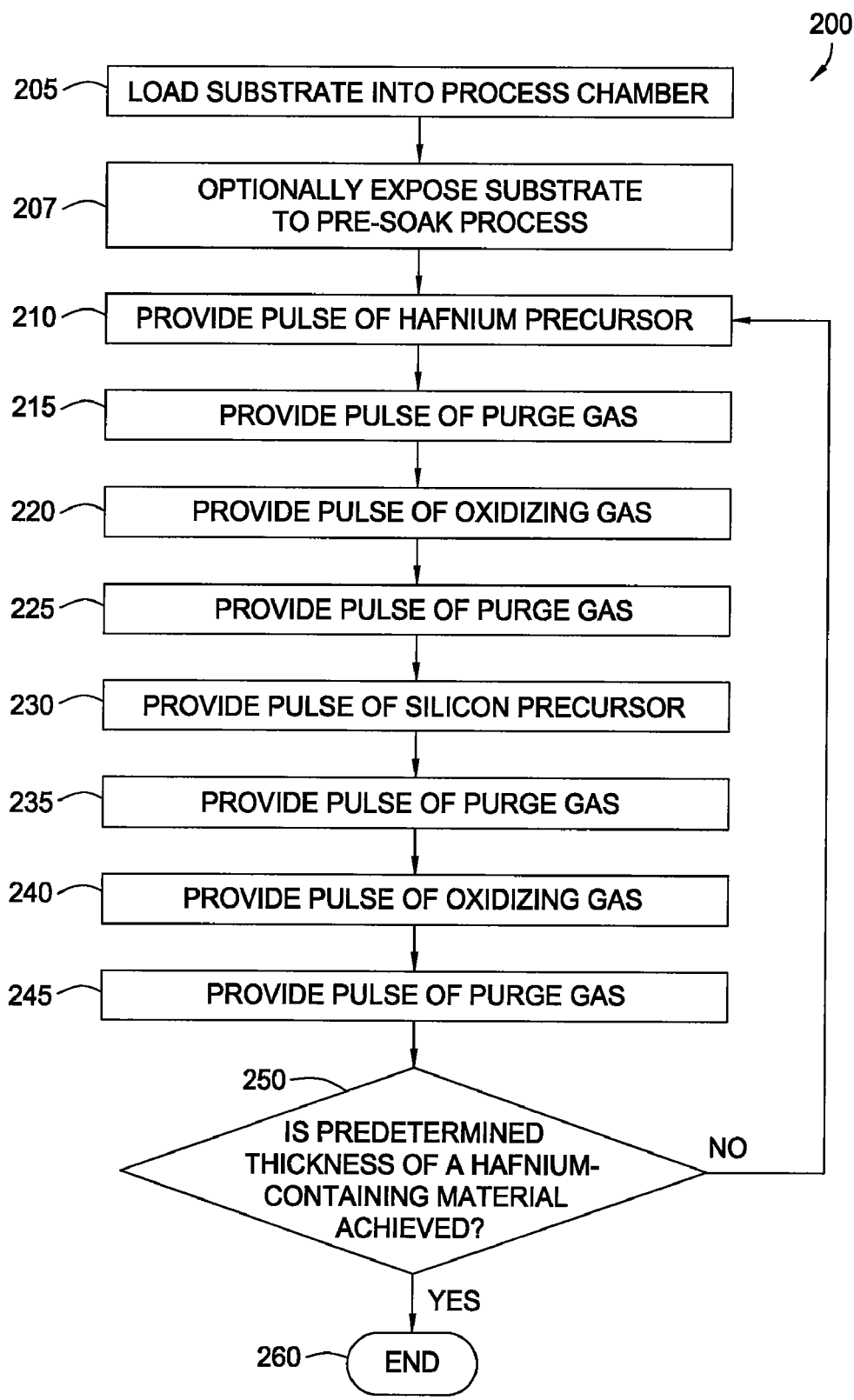
FIG. 3 shows a process sequence for depositing a hafnium-containing material by an ALD process according to another embodiment described herein.

In another embodiment, FIG. 3 illustrates an exemplary process sequence 200 for forming a hafnium-containing material, such as hafnium silicate. A substrate is loaded into a process chamber capable of performing cyclical deposition and the process conditions are adjusted (step 205). The substrate may be exposed to an optional pre-soak process and purge prior to starting an ALD cycle (step 207). The substrate is exposed to pulse of a hafnium precursor that is introduced into the process chamber for a time period in a range from about 0.1 seconds to about 5 seconds (step 210). A pulse of purge gas is introduced into the process chamber (step 215) to purge or otherwise remove any residual hafnium precursor or by-products. Next, a pulse of oxidizing gas is introduced into the process chamber for a time period in a range from about 0.1 seconds to about 10 seconds (step 220). The oxidizing gas may include several oxidizing agents, such as water vapor and oxygen derived from a WVG system. A pulse of purge gas is again introduced into the process chamber (step 225) to purge or otherwise remove any residual oxidizing compound or by-products. The substrate is then exposed to pulse of a silicon precursor that is introduced into the process chamber for a time period in a range from about 0.1 seconds to about 10 seconds (step 230). A pulse of purge gas is again pulsed into the process chamber (step 235) to purge or otherwise remove any residual silicon precursor or by-products. Next, another pulse of oxidizing gas is introduced into the process chamber for a time period in a range from about 0.1 seconds to 10 seconds (step 240). A pulse of purge gas is again introduced into the processing chamber (step 245) to purge or otherwise remove any residual oxidizing compound or by-products. Suitable carrier gases or purge gases may include helium, argon, nitrogen, hydrogen, forming gas, oxygen or combinations thereof.

Referring to step 250, after each deposition cycle (steps 210 through 245), a hafnium-containing material, such as hafnium silicate, having a first thickness is deposited on the substrate surface. Usually, each deposition cycle forms a layer with a thickness in the range from about 0.5 Å to about 10 Å. Depending on specific device requirements, subsequent deposition cycles may be needed to deposit a hafnium-containing material with a predetermined thickness. A deposition cycle (steps 210 through 245) may be repeated until the desired or predetermined thickness for the hafnium-containing material is achieved at step 250 and process sequence 200 is stopped at step 260.

The hafnium silicate material formed by the deposition processes described herein has the empirical chemical formula $HfSi_yO_x$. Hafnium silicate may be a homogenous mixture of hafnium oxide ($HfO_x$ or $HfO_2$) and silicon oxide ($SiO_x$ or $SiO_2$) or a single phase $HfSiO_4$ material. Hafnium silicate may have the molecular chemical formula $HfSiO_4$, but by varying process conditions (e.g., timing, temperature, precursors), hafnium silicates may vary by elemental concentration, for example, $HfSiO_{3.8}$ or $HfSi_{0.8}O_{3.8}$.

The ALD process depicted in FIG. 3 typically occurs within a process chamber at a pressure in a range from about 1 Torr to about 100 Torr, preferably from about 1 Torr to about 20 Torr, and more preferably, from about 1 Torr to about 10 Torr. The temperature of the substrate is usually in a range from about 70° C. to about 1,000° C., preferably from about 100° C. to about 650° C., and more preferably from about 250° C. to about 500° C. The optional pre-soak process in step 207 is subsequent to starting an ALD cycle and may include exposing the substrate to the oxidizing gas containing water vapor generated from a WVG system, as described in step 115.

During step 210, the hafnium precursor is introduced into the process chamber with a flow rate in the range from about 5 sccm to about 200 sccm. The hafnium precursor is usually introduced with a carrier gas, such as nitrogen, with a total flow rate in the range from about 50 sccm to about 1,000 sccm. The hafnium precursor is pulsed into the process chamber at a rate in a range from about 0.1 seconds to about 10 seconds. In one embodiment, the hafnium precursor is pulsed at a rate in a range from about 1 second to about 5 seconds, for example, about 3 seconds. In another embodiment, the hafnium precursor is pulsed at a rate in a range from about 0.1 seconds to about 1 second, for example, about 0.5 seconds. In some examples, the hafnium precursor is preferably hafnium tetrachloride, while in other examples, the hafnium precursor is preferably TDEAH or other tetrakis(dialkylamino)hafnium compounds.

In one embodiment, the hafnium precursor is generally dispensed into process chamber 280 by introducing a carrier gas through ampoule 282 containing the hafnium precursor, as depicted in FIG. 2A. The temperature of ampoule 282 is maintained at a temperature depending on the hafnium precursor within, such as in a range from about 20° C. to about 300° C. In one example, ampoule 282 contains $HfCl_4$ at a temperature in a range from about 150° C. to about 200° C. In another example, ampoule 282 containing a liquid precursor (e.g., TDEAH, TDMAH, TDMAS or Tris-DMAS) may be pressurized to transfer the liquid precursor to injector valve system 281. Generally, ampoule 282 containing a liquid precursor may be pressurized at a pressure in a range from about 138 kPa (about 20 psi) to about 414 kPa (about 60 psi) and may be heated to a temperature of about 100° C. or less, preferably in a range from about 20° C. to about 60° C. Injector valve system 281 combines the liquid precursor with a carrier gas to form a precursor vapor that is injected into process chamber 280. A carrier gas may include nitrogen, argon, helium, hydrogen or combinations thereof and the carrier may be pre-heated to a temperature in a range from about 85° C. to about 150° C.

In steps 220 and 240, oxidizing gas containing water vapor is introduced into process chamber 280 at a rate in the range from about 20 sccm to about 1,000 sccm, preferably from about 50 sccm to about 200 sccm. The oxidizing gas is pulsed into process chamber 280 a rate in a range from about 0.1 seconds to about 10 seconds, depending on the particular process conditions and desired composition of the deposited hafnium-containing material. In one embodiment, the oxidizing gas is pulsed at a rate from about 1 second to about 3 seconds, for example, about 1.7 seconds. In another embodiment, the oxidizing gas is pulsed at a rate from about 0.1 seconds to about 1 second, for example, about 0.5 seconds.

The oxidizing gas may be produced from WVG system 286 that is in fluid communication with process chamber 280 by conduit 287. A hydrogen source gas ($H_2$) and an oxygen source gas ($O_2$) each flow independently into WVG system 286 with a flow rate in a range from about 20 sccm to about 300 sccm. Generally, the oxygen source gas is at a higher flow rate than the hydrogen source gas. In one example, the hydrogen source gas has a flow rate of about 100 sccm and oxygen source gas has a flow rate of about 120 sccm to enrich the water vapor with oxygen.

In another embodiment of the WVG system, the flow of hydrogen is higher than the flow of oxygen, for example, the hydrogen source gas has a flow rate of about 250 sccm and oxygen source gas has a flow rate of about 100 sccm. Therefore, the water vapor flowing from the WVG system is enriched with hydrogen. For example, when the hydrogen source gas has a flow rate of about 250 sccm and the oxygen source gas has a flow rate of about 100 sccm, the outflow of oxidizing gas contains partial flow rates of water vapor of about 100 sccm and hydrogen of about 50 sccm. A water vapor enriched with hydrogen has several important functions. First, an excess of hydrogen in the water vapor increases the removal rate of certain contaminants, such as halogens. During deposition processes containing $HfCl_4$ or other halogenated precursors, an excess of hydrogen gas reacts with chlorine to form hydrogen chloride as a volatile product easily removed by the purge steps. Secondarily, an excess of hydrogen within a water vapor prevents oxidation of some metal gate layers. In a MIM capacitor or device, a stack may contain a dielectric layer sandwiched between two metal layers, such as aluminum or tungsten. While forming the dielectric layer, such as a silicate compound, the excess hydrogen reduces the metal layer while the water vapor oxidizes the dielectric layer.

During step 230, the silicon precursor is introduced to the process chamber with a flow rate in a range from about 5 sccm to about 200 sccm or with a flow rate in the range from about 1 mg/min to about 50 mg/min, preferably about 5 mg/min to about 25 mg/min. The silicon precursor is usually introduced with a carrier gas, such as nitrogen, with a total flow rate in the range from about 50 sccm to about 1,000 sccm. The silicon precursor is pulsed into the process chamber at a rate in a range from about 0.1 seconds to about 10 seconds, depending on the particular process and desired silicon concentration. In one embodiment, the silicon precursor is pulsed at a rate in a range from about 1 second to about 5 seconds, for example, about 3 seconds. In another embodiment, the silicon precursor is pulsed at a rate in a range from about 0.1 seconds to about 1 second, for example, about 0.5 seconds. In some examples, the silicon precursor is preferably tris(dimethylamino)silane (($Me_2N)_3SiH$ or Tris-DMAS), tetrakis(dimethylamino)silane (($Me_2N)_4Si$ or TDMAS) or other dialkylaminosilanes, while in other examples the silicon precursor is preferably silane ($SiH_4$).

The pulses of a purge gas, such as argon or nitrogen, during steps 215, 225, 235 and 245 are typically introduced with a flow rate in a range from about 2 slm to about 22 slm, preferably about 10 slm. Each process cycle (steps 210 through 245) may occur for a time period in a range from about 2 seconds to about 40 seconds. In one example, the time period of the process cycle lasts about 20 seconds, while in another example, the time period of the process cycle lasts about 4 seconds. Longer process steps lasting about 20 seconds deposit excellent hafnium-containing films, but with reduced throughput.

In another embodiment, hafnium-containing materials, such as hafnium silicate, may be formed by omitting either of the steps that introduce the oxidizing gas and the subsequent purge step. In one example, steps 220 and 225 are omitted, therefore a hafnium silicate material may be formed by sequentially pulsing the hafnium precursor, purge gas, silicon precursor, purge gas, oxidizing gas and purge gas. In another example, steps 240 and 245 are omitted, therefore a hafnium silicate material may be formed by sequentially pulsing the hafnium precursor, purge gas, oxidizing gas, purge gas, silicon precursor and purge gas.

Figure 4:
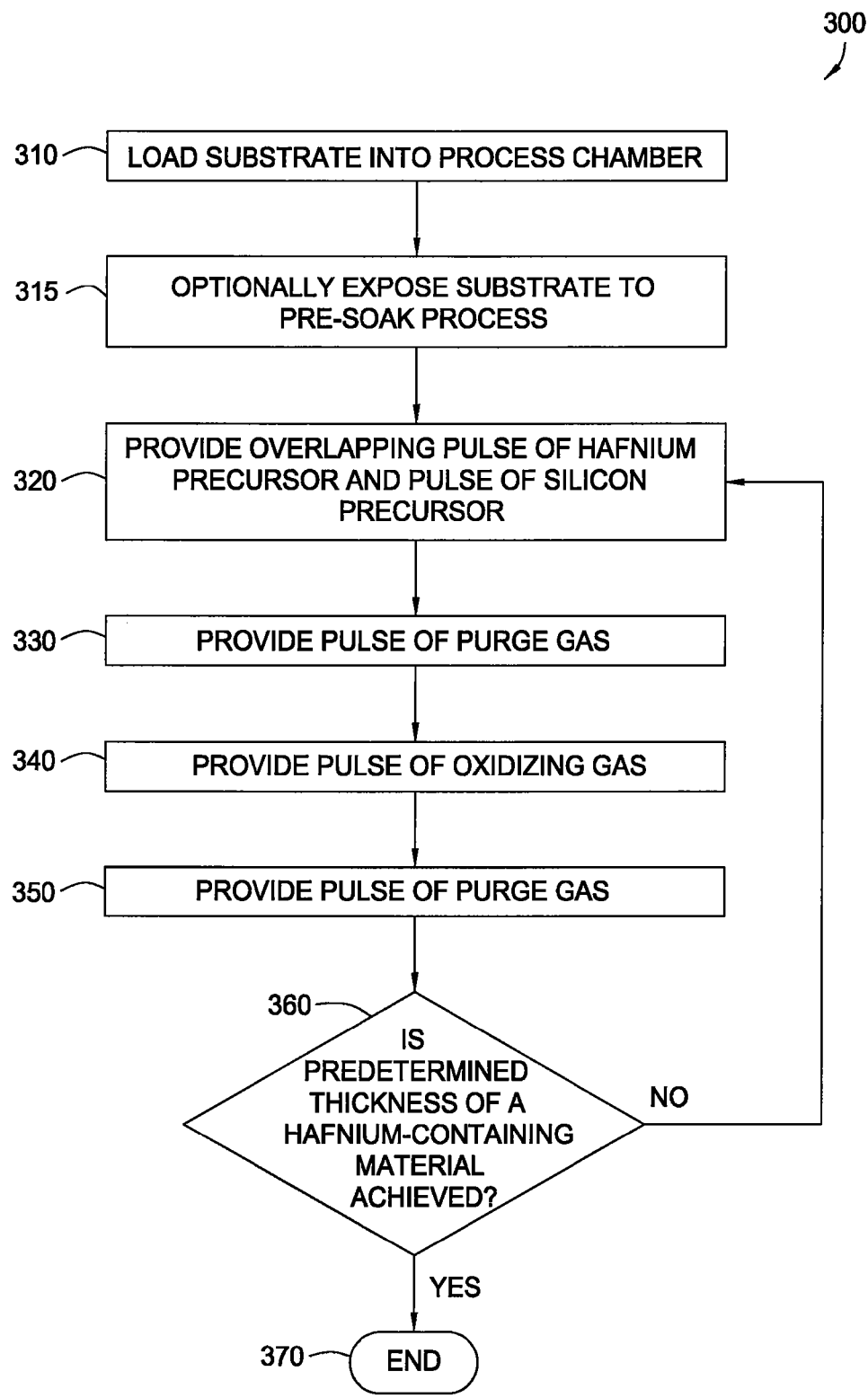
FIG. 4 shows a process sequence for depositing a hafnium-containing material by an ALD process according to another embodiment described herein.

FIG. 4 illustrates an exemplary process sequence 300 for forming a hafnium-containing material, such as a hafnium silicate, according to another embodiment of the invention. A substrate is loaded into a process chamber capable of performing cyclical deposition and the process conditions are adjusted (step 310). The substrate may be exposed to an optional pre-soak process and purge prior to starting an ALD cycle (step 315). The substrate is exposed to a pulse of a hafnium precursor and a pulse of a silicon precursor that completely or at least partially overlap in time and are introduced into the process chamber for a time period in a range from about 0.1 seconds to about 5 seconds (step 320). A pulse of purge gas is pulsed into the processing chamber (step 330) to purge or otherwise remove any residual hafnium precursor, silicon precursor or by-products. Next, a pulse of oxidizing gas is introduced into the processing chamber (step 340). The oxidizing gas may include several oxidizing agents, such as water vapor and oxygen derived from a WVG system. A pulse of purge gas is again introduced into the processing chamber (step 350) to purge or otherwise remove any residual reducing compound. Suitable carrier gases or purge gases may include helium, argon, nitrogen, hydrogen, forming gas, oxygen or combinations thereof.

Referring to step 360, after each deposition cycle (steps 320 through 350), a hafnium-containing material, such as a hafnium silicate, having a first thickness will be deposited on the substrate surface. During the ALD process, each deposition cycle forms a layer with a thickness in the range from about 0.5 Å to about 10 Å. Depending on specific device requirements, subsequent deposition cycles may be needed to deposit a hafnium-containing material with a predetermined thickness. A deposition cycle (steps 320 through 350) may be repeated until the desired or predetermined thickness for the hafnium-containing material is achieved at step 360 and process sequence 300 is stopped at step 370.

The ALD process depicted in FIG. 4 typically occurs within a process chamber at a pressure in a range from about 1 Torr to about 100 Torr, preferably from about 1 Torr to about 20 Torr, and more preferably from about 1 Torr to about 10 Torr. The temperature of the substrate is usually in a range from about 70° C. to about 1,000° C., preferably from about 100° C. to about 650° C., and more preferably from about 250° C. to about 500° C. The optional pre-soak process in step 315 is subsequent to starting an ALD cycle and may include exposing the substrate to the oxidizing gas containing water vapor generated from a WVG system, as described in step 115.

During step 320, the hafnium precursor and the silicon precursor are each introduced by flowing into the process chamber as a pulse of precursor, i.e., a pulsed precursor is the introduction of that precursor into the process chamber. In FIGS. 5A-5E, $t_1$ corresponds to the time period that a hafnium precursor and a silicon precursor are pulsed during step 320, while $t_2$ corresponds to the time period during steps 330, 340 and 350. The time periods $t_1$ and $t_2$ are not graphed to scale relative to each other. In one embodiment depicted in FIG. 5A, the hafnium precursor and silicon precursor are independently pulsed during the same time period, such that both precursors flow during all of $t_1$. For example, a hafnium precursor and a silicon precursor are simultaneously pulsed for about 2 seconds.

Figure 5:
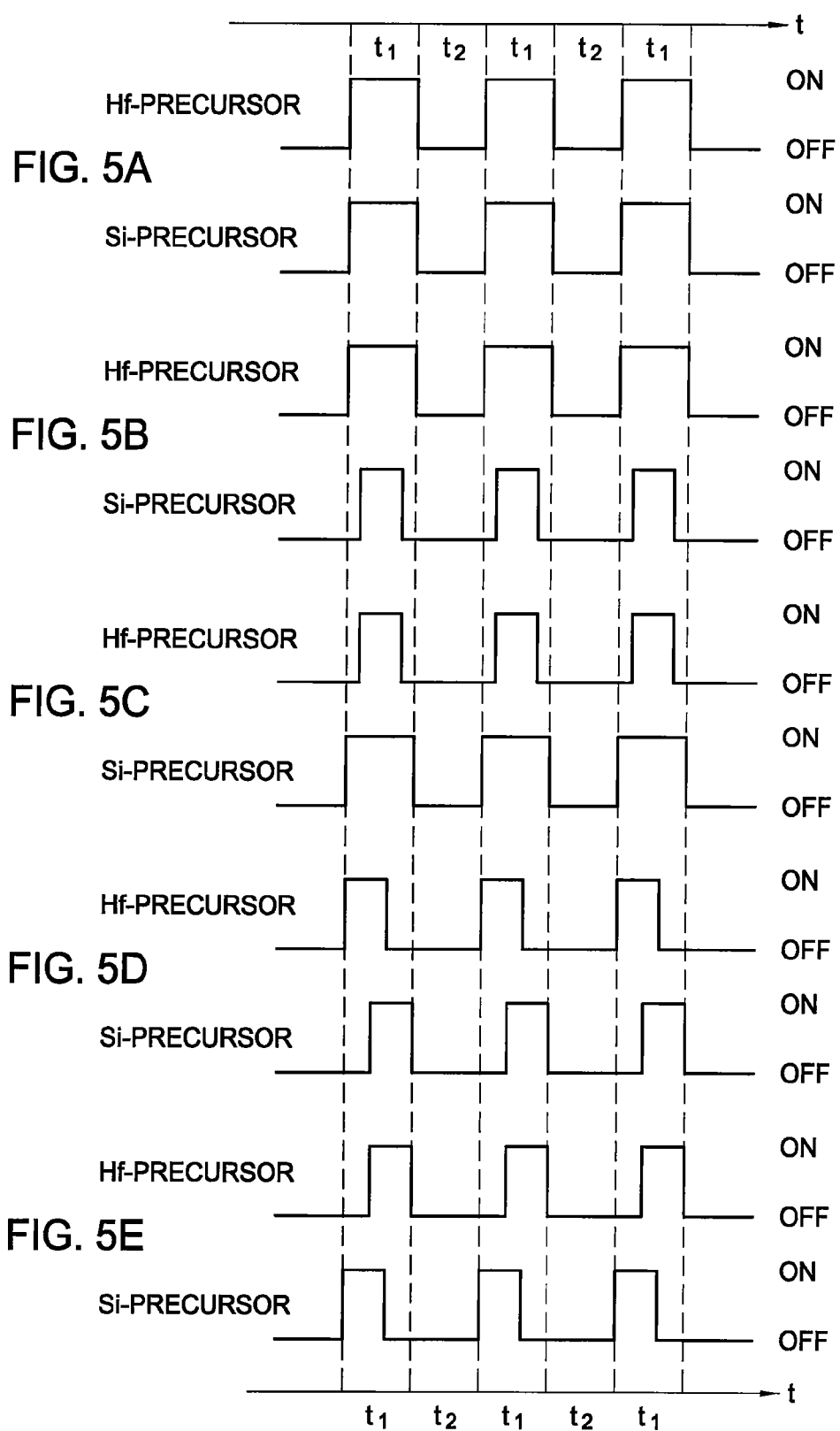
FIGS. 5A-5E show some of the pulsing sequences for the hafnium and silicon precursors during ALD process according to embodiments described herein.

In another embodiment depicted by FIGS. 5B-5C, the hafnium precursor and silicon precursor are independently pulsed, so that a first precursor flows during all of $t_1$ and the second precursor flows during the intermediate of $t_1$. For example, in FIG. 5B when $t_1$ lasts about 2 seconds, a hafnium precursor is pulsed for about 2 seconds and a silicon precursor is pulsed for about 1.5 seconds during the intermediate of the pulsed hafnium precursor. Alternatively, in FIG. 5C when $t_1$ lasts about 2 seconds, a silicon precursor is pulsed for about 2 seconds and a hafnium precursor is pulsed for about 1.5 seconds during the intermediate of the pulsed silicon precursor.

In another embodiment depicted by FIGS. 5D-5E, the hafnium precursor and silicon precursor are independently pulsed with a partially overlap, such that a first precursor flows at the beginning of $t_1$ but does not flow to the end of $t_1$ and the second precursor does not flow at the beginning of $t_1$, but does flow to the end of $t_1$. For example, in FIG. 5D when $t_1$ lasts about 2 seconds, a hafnium precursor is pulsed for about 1.5 seconds at the beginning of $t_1$ and a silicon precursor is pulsed for about 1.5 seconds at the end of $t_1$. In another example, in FIG. 5E when $t_1$ lasts about 2 seconds, a silicon precursor is pulsed for about 1.75 seconds at the beginning of $t_1$ and a hafnium precursor is pulsed for about 1.5 seconds at the end of $t_1$.

Alternatively, a first precursor (e.g., hafnium precursor) may be pulsed during any portion of time period $t_1$ while overlapping or not overlapping a second precursor (e.g., silicon precursor) may also be pulsed during any portion of time period $t_1$. Therefore, a hafnium precursor, a silicon precursor or other precursor may be independently pulsed into the process chamber with any partial overlap of time or with no overlap of time. In one example when $t_1$ lasts about 2 seconds, a hafnium precursor is pulsed for about 2 seconds and a silicon precursor is pulsed for 0.5 seconds during the pulse of hafnium precursor. In another example when $t_1$ lasts about 2 seconds, a hafnium precursor is pulsed for about 0.5 seconds and a silicon precursor is pulsed for 0.5 seconds with no overlap of or not during the pulse of hafnium precursor. In another example when $t_1$ lasts about 2 seconds, a hafnium precursor is pulsed for about 0.5 seconds and a silicon precursor is pulsed for 0.5 seconds with an overlap of or during the pulse of hafnium precursor. Also, multiple pulses a first precursor and a second precursor may be pulsed during time period $t_1$.

During step 320, the hafnium precursor is introduced into the process chamber with a flow rate in a range from about 5 sccm to about 200 sccm. The hafnium precursor is usually introduced with a carrier gas, such as nitrogen, with a total flow rate in a range from about 50 sccm to about 1,000 sccm. The hafnium precursor may be pulsed into the process chamber at a rate in a range from about 0.1 seconds to about 10 seconds. In one embodiment, the hafnium precursor is pulsed at a rate in a range from about 1 second to about 5 seconds, for example, about 3 seconds. In another embodiment, the hafnium precursor is pulsed at a rate in a range from about 0.1 seconds to about 1 second, for example, about 0.5 seconds. In some example, the hafnium precursor is preferably hafnium tetrachloride, while in other examples, the hafnium precursor is preferably TDEAH.

The hafnium precursor is generally dispensed into process chamber 280 by introducing a carrier gas through ampoule 282 containing the hafnium precursor, as depicted in FIG. 2A. The carrier gas and the hafnium precursor form a precursor vapor that flows through conduit 283 into process chamber 280. The temperature of ampoule 282 is maintained at a temperature depending on the hafnium precursor within, such as in a range from about 20° C. to about 300° C. In one example, ampoule 282 contains $HfCl_4$ at a temperature in a range from about 150° C. to about 200° C. In another example, ampoule 282 containing a liquid precursor (e.g., TDEAH, TDMAH, TDMAS or Tris-DMAS) may be pressurized to transfer the liquid precursor to injector valve system 281. Generally, ampoule 282 containing a liquid precursor may be pressurized at a pressure in a range from about 138 kPa (about 20 psi) to about 414 kPa (about 60 psi) and may be heated to a temperature of about 100° C. or less, preferably in a range from about 20° C. to about 60° C. Injector valve system 281 combines the liquid precursor with a carrier gas to form a precursor vapor that is injected into process chamber 280. A carrier gas may include nitrogen, argon, helium, hydrogen or combinations thereof and the carrier may be pre-heated to a temperature in a range from about 85° C. to about 150° C.

During step 320, the silicon precursor is introduced into the process chamber with a flow rate in a range from about 5 sccm to about 200 sccm or with a flow rate in a range from about 1 mg/min to about 50 mg/min, preferably from about 5 mg/min to about 25 mg/min. The silicon precursor is usually introduced with a carrier gas, such as nitrogen, with a total flow rate in a range from about 50 sccm to about 1,000 sccm. The silicon precursor is pulsed into the process chamber at a rate in a range from about 0.1 seconds to about 10 seconds. In one embodiment, the silicon precursor is pulsed at a rate in a range from about 1 second to about 5 seconds, for example, about 3 seconds. In another embodiment, the silicon precursor is pulsed at a rate in a range from about 0.1 seconds to about 1 second, for example, about 0.5 seconds. In some examples, the silicon precursor is preferably Tris-DMAS or TDMAS, while in other examples, the silicon precursor is preferably silane.

In an alternative embodiment during step 320, the hafnium precursor and the silicon precursor may be combined prior to pulsing into the process chamber. The hafnium/silicon precursor mixture is formed by combining a proportional amount of a hafnium precursor and a silicon precursor in order to achieve a desired Hf:Si ratio within the deposited hafnium-containing material. A process gas containing the hafnium/silicon precursor mixture may be formed by flowing a carrier gas through the precursor mixture within an ampoule. The hafnium/silicon precursor mixture is sequentially pulsed with the oxidizing gas by an ALD process to form a hafnium-containing material, such as a hafnium silicate material. Hafnium silicates deposited by the processes described herein have the empirical chemical formula $HfSi_yO_x$, wherein y may be adjusted by varying the molar ratio of the hafnium precursor and the silicon precursor within the hafnium/silicon precursor mixture. For example, if the ratio of hafnium precursor to silicon precursor is greater than 1, than y is probably less than 1. However, if the ratio of hafnium precursor to silicon precursor is less than 1, than y is probably greater than 1.

During step 340, the oxidizing gas is introduced into process chamber 280 with a flow rate in a range from about 20 sccm to about 1,000 sccm, preferably in a range from about 50 sccm to about 200 sccm. The oxidizing gas is pulsed into process chamber 280 at a rate in a range from about 0.1 seconds to about 10 seconds. In one embodiment, the oxidizing gas is pulsed at a rate in a range from about 1 second to about 3 seconds, for example, about 1.7 seconds. In another embodiment, the oxidizing gas is pulsed at a rate in a range from about 0.1 seconds to about 1 second, for example, about 0.5 seconds.

In one embodiment of process sequence 300, the oxidizing gas is produced from WVG system 286 that is in fluid communication to process chamber 280 by conduit 287. The hydrogen source gas and the oxygen source gas each flow into WVG system 286 with a flow rate in a range from about 20 sccm to about 200 sccm. Generally, the flow rate of the oxygen source gas is higher than the flow rate of the hydrogen source gas, for example, the hydrogen source gas has a flow rate of about 100 sccm and the oxygen source gas has a flow rate of about 120 sccm. Therefore, the water vapor flowing from WVG system 286 is enriched with oxygen. For example, when the hydrogen source gas has a flow rate of about 100 sccm and the oxygen source gas has a flow rate of about 120 sccm, the outflow of oxidizing gas includes partial flow rates of water vapor of about 100 sccm and oxygen of about 70 sccm. In another example, the hydrogen source gas has a flow rate of about 250 sccm and the oxygen source gas has a flow rate of about 100 sccm. Therefore, the water vapor flowing from the WVG system is enriched with hydrogen.

The pulses of a purge gas, such as argon or nitrogen, during steps 330 and 350, are typically introduced with a flow rate in a range from about 2 slm to about 22 slm, preferably about 10 slm. Each process cycle (steps 320 through 350) may occur for a time period in a range from about 0.5 seconds to about 20 seconds. In one example, the process cycle lasts about 10 seconds. In another example, the process cycle lasts about 2 seconds.

In some of the embodiments containing process sequences 100, 200 and 300, an alternative oxidizing gas, such as a traditional oxidant, may be used instead of the oxidizing gas containing water vapor formed from a WVG system. The alternative oxidizing gas is introduced into the process chamber from an oxygen source containing water not derived from a WVG system, oxygen ($O_2$), ozone ($O_3$), atomic-oxygen (O), hydrogen peroxide ($H_2O_2$), nitrous oxide ($N_2O$), nitric oxide (NO), dinitrogen pentoxide ($N_2O_5$), nitrogen dioxide ($NO_2$), derivatives thereof or combinations thereof. While embodiments of the invention provide processes that benefit from oxidizing gas containing water vapor formed from a WVG system, other embodiments provide processes that utilize the alternative oxidizing gas or traditional oxidants while forming hafnium-containing materials and other dielectric materials during deposition processes described herein.

Many precursors are within the scope of embodiments of the invention for depositing the dielectric materials described herein. One important precursor characteristic is to have a favorable vapor pressure. Precursors at ambient temperature and pressure may be gas, liquid or solid. However, volatilized precursors are used within the ALD chamber. Organometallic compounds contain at least one metal atom and at least one organic-containing functional group, such as amides, alkyls, alkoxyls, alkylaminos or anilides. Precursors may include organometallic, inorganic or halide compounds.

Exemplary hafnium precursors include hafnium compounds containing ligands such as halides, alkylaminos, cyclopentadienyls, alkyls, alkoxides, derivatives thereof or combinations thereof. Hafnium halide compounds useful as hafnium precursors may include $HfCl_4$, $HfI_4$, and $HfBr_4$. Hafnium alkylamino compounds useful as hafnium precursors include $(RR'N)_4Hf$, where R or R' are independently hydrogen, methyl, ethyl, propyl or butyl. Hafnium precursors useful for depositing hafnium-containing materials include $(Et_2N)_4Hf$, $(Me_2N)_4Hf$, $(MeEtN)_4Hf$, $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$ or derivatives thereof. Preferably, hafnium precursors used during the deposition process herein include $HfCl_4$, $(Et_2N)_4Hf$ or $(Me_2N)_4Hf$.

Exemplary silicon precursors useful for depositing silicon-containing materials include silanes, alkylaminosilanes, silanols or alkoxy silanes, for example, silicon precursors may include $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSi(OH)_3$, $Me_2Si(OH)_2$, $(MeO)_4Si$, $(EtO)_4Si$ or derivatives thereof. Other alkylaminosilane compounds useful as silicon precursors include $(RR'N)_{4-n}SiH_n$, where R or R' are independently hydrogen, methyl, ethyl, propyl or butyl and n=0-3. Other alkoxy silanes may be described by the generic chemical formula $(RO)_{4-n}SiL_n$, where R=methyl, ethyl, propyl or butyl and L=H, OH, F, Cl, Br or I and mixtures thereof. Also, higher silanes are used as silicon precursors within some embodiments of the invention. Higher silanes are disclosed in commonly assigned U.S. patent application Ser. No. 10/688,797, filed on Oct. 17, 2003, entitled, "Silicon-containing Layer Deposition with Silicon Compounds," and published as US 20040224089, is incorporated herein by reference in entirety for the purpose of describing silicon precursors. Preferably, silicon precursors used during the deposition process herein include $(Me_2N)_3SiH$, $(Et_2N)_3SiH$, $(Me_2N)_4Si$, $(Et_2N)_4Si$ or $SiH_4$.

In some embodiments, nitrogen may be added to the hafnium-containing materials and other dielectric materials deposited during processes described herein. In one example, a hafnium oxide material may be nitrided to form a hafnium oxynitride material, as well as a hafnium silicate material may be nitrided to form a hafnium silicon oxynitride material. In one example, a hafnium silicate film is deposited silicon-rich and contains little or no nitrogen near the substrate/dielectric interface. As the film thickness is increased, more hafnium is incorporated into the film in order to increase the dielectric constant. Nitrogen may also be added to the bulk of the film to decrease the diffusion of dopants through the film. Alternatively, nitrogen may be added near the top of the film in order to provide a stable capping layer.

Nitrogen may also be added to hafnium-containing materials and other dielectrics materials by nitrogen bombardment, such as with a nitrogen plasma, annealing the substrate in a nitrogen-containing environment, and/or including a nitrogen precursor into an additional half reaction within the ALD cycle. A nitrogen plasma process may include exposing the substrate surface to a plasma nitridation process after a half reaction, at the completion of an ALD cycle and/or at the completion of the deposition of a hafnium-containing material. For example, a nitridizing remote-plasma is exposed to a hafnium oxide film to form a hafnium oxynitride film or to a hafnium silicate film to form a hafnium silicon oxynitride film.

In another embodiment, a hafnium-containing material deposited on a substrate is annealed in a nitrogen-containing environment, such as $N_2$, $NH_3$, $N_2H_4$, NO, $N_2O$, atomic-N or combinations thereof. The substrate is heated to a temperature in the range from about 800° C. to about 1,100° C. for a time period in the range from about 15 seconds to about 10 minutes. For example, a substrate containing a hafnium silicate film is thermally annealed at 900° C. for 1 minute in a chamber filled with $NH_3$ to form a hafnium silicon oxynitride film.

In another embodiment, the hafnium silicon oxynitride material may be formed during an ALD process by providing cycles containing a hafnium precursor half reaction, a silicon precursor half reaction, a nitrogen precursor half reaction, and at least one oxidizing gas half reaction. The nitrogen precursor half reaction may be added into the ALD process during a cycle at any ratio relative to the hafnium, silicon and oxygen precursor half reactions. In one example, a nitrogen precursor half reaction is added at about every two ALD cycles of hafnium, silicon and oxygen precursor half reactions. Furthermore, the cycle ratio can be varied in order to control the nitrogen ratio incorporated within film depth. In one embodiment, an ALD process may form a hafnium silicon oxynitride graded film with a higher concentration of nitrogen near the top of the film than in a lower portion of the film. Generally, the top of the film containing the higher nitrogen concentration is about the upper 20% or less of the film, preferably, the upper 10% or less, and more preferably, the upper 5% or less. If the silicon precursor half reaction is omitted, than a hafnium oxynitride film may be grown in a similar ALD cycle. Preferably, the oxidizing gas contains water vapor formed from a WVG system.

Exemplary nitrogen precursors may include: $NH_3$, $N_2$, hydrazines (e.g., $N_2H_4$ or $MeN_2H_3$), amines (e.g., $Me_3N$, $Me_2NH$ or $MeNH_2$), anilines (e.g., $C_6H_5NH_2$), organic azides (e.g., $MeN_3$ or $Me_3SiN_3$), inorganic azides (e.g., $NaN_3$ or $Cp_2CoN_3$), radical nitrogen compounds (e.g., $N_3$, $N_2$, N, NH or $NH_2$), derivatives thereof or combinations thereof. Radical nitrogen compounds can be produced by heat, hot-wires or plasma.

In an alternative embodiment, a variety of metal oxides and metal silicates may be formed by sequentially pulsing metal precursors with oxidizing gas containing water vapor derived from a WVG system. The ALD processes disclosed herein (e.g., process sequences 100, 200 and 300) above may be altered by substituting the hafnium and/or silicon precursors with other metal precursors to form additional dielectric materials, such as hafnium aluminates, titanium silicates, zirconium oxides, zirconium silicates, zirconium aluminates, tantalum oxides, tantalum silicates, titanium oxides, titanium silicates, silicon oxides, aluminum oxides, aluminum silicates, lanthanum oxides, lanthanum silicates, lanthanum aluminates, nitrides thereof, derivatives thereof or combinations thereof. In one embodiment, two or more ALD processes are concurrently conducted to deposit one layer on top of another. For example, a combined process contains a first ALD process to form a first dielectric material and a second ALD process to form a second dielectric material. The combined process may be used to produce a variety of hafnium-containing materials, for example, hafnium aluminum silicate or hafnium aluminum silicon oxynitride. In one example, a dielectric stack material is formed by depositing a first hafnium-containing material on a substrate and subsequently depositing a second hafnium-containing material thereon. The first and second hafnium-containing materials may vary in composition, so that one layer may contain hafnium oxide and the other layer may contain hafnium silicate. In one aspect, the lower layer contains silicon. Alternative metal precursors used during ALD processes described herein include $ZrCl_4$, $Cp_2Zr$, $(Me_2N)_4Zr$, $(Et_2N)_4Zr$, $TaF_5$, $TaCl_5$, ($^t$BuO)$_5$Ta, (Me$_2$N)$_5$Ta, (Et$_2$N)$_5$Ta, (Me$_2$N)$_3$Ta(N$^t$Bu), (Et$_2$N)$_3$Ta(N$^t$Bu), TiCl$_4$, TiI$_4$, ($^i$PrO)$_4$Ti, (Me$_2$N)$_4$Ti, (Et$_2$N)$_4$Ti, AlCl$_3$, Me$_3$Al, Me$_2$AlH, (AMD)$_3$La, ((Me$_3$Si)($^t$Bu)N)$_3$La, ((Me$_3$Si)$_2$N)$_3$La, ($^t$Bu$_2$N)$_3$La, ($^i$Pr$_2$N)$_3$La, derivatives thereof or combinations thereof.

Many industrial applications exist for the product dielectric materials formed during deposition process described by the various embodiments herein. Within the microelectronics industry, the product materials may be used as high-k transistor gate dielectric materials, transistor gate interface engineering, high-k capacitor dielectric materials (DRAMs), seed layers, diffusion barrier layers, adhesion layers, insulator layers and functionalized surface groups for patterned surfaces (e.g., selective deposition). In the realm of microelectromechanical systems (MEMS), the materials formed during process described herein may be used as insulating or structural films.

Hardware

Figure 6:
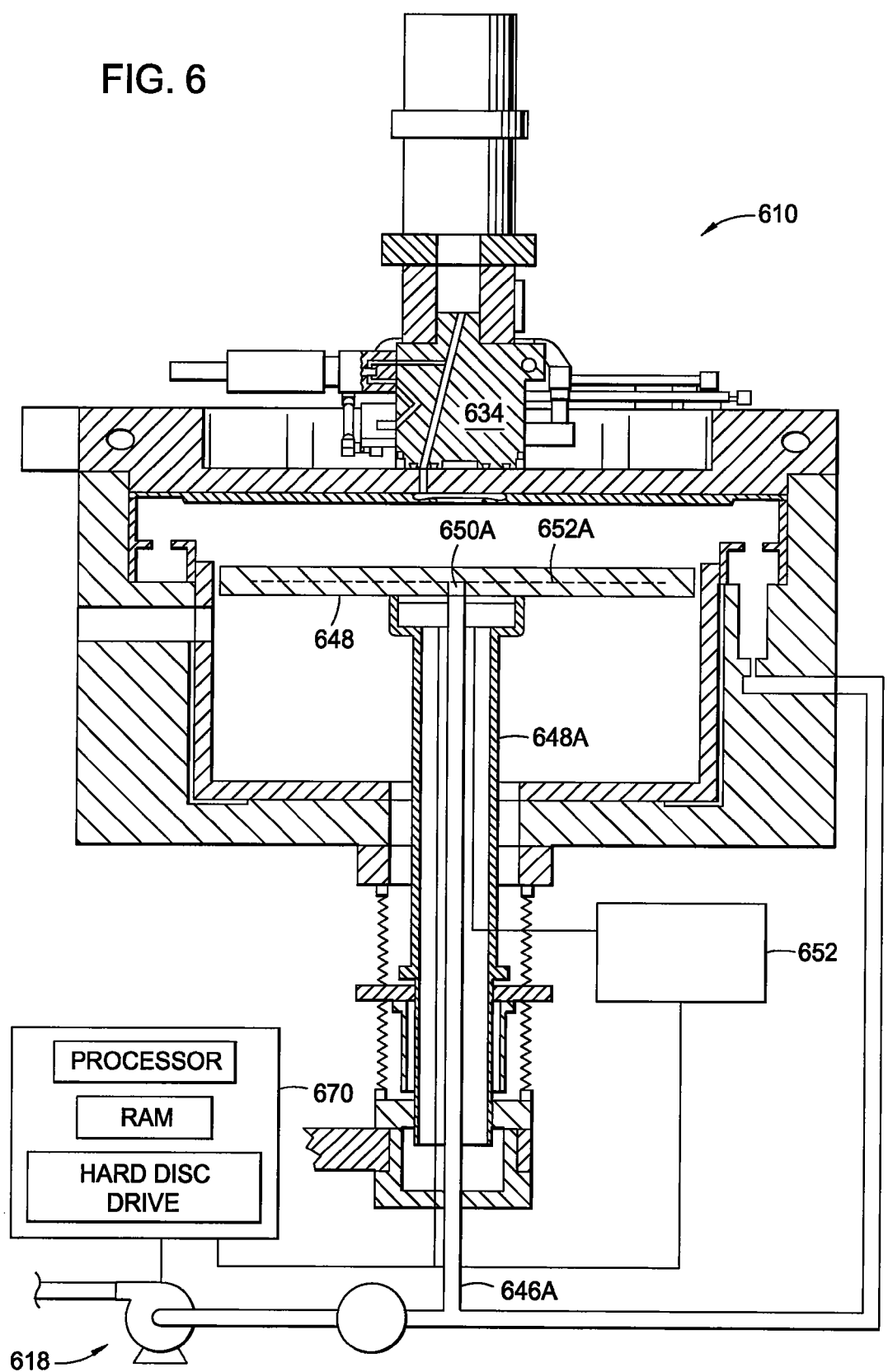
FIG. 6 depicts a schematic cross-sectional view of a process chamber that may be used during a deposition process according to an embodiment described herein.

FIG. 6 depicts a schematic cross-sectional view of process chamber 610 that can be used to perform integrated circuit fabrication in accordance with embodiments described herein. Process chamber 610 generally houses substrate support pedestal 648, which is used to support a substrate (not shown). Substrate support pedestal 648 is movable in a vertical direction inside process chamber 610 using displacement mechanism 648A.

Depending on the specific process, the substrate can be heated to some desired temperature prior to or during deposition. For example, substrate support pedestal 648 may be heated using embedded heating element 652A. Substrate support pedestal 648 may be resistively heated by applying an electric current from AC power supply 652 to heating element 652A. The substrate (not shown) is, in turn, heated by support pedestal 648. Alternatively, substrate support pedestal 648 may be heated using radiant heaters such as, for example, lamps (not shown).

Temperature sensor 650A, such as a thermocouple, is also embedded in substrate support pedestal 648 to monitor the temperature of pedestal 648 in a conventional manner. The measured temperature is used in a feedback loop to control AC power supply 652 for heating element 652A, such that the substrate temperature can be maintained or controlled at a desired temperature which is suitable for the particular process application.

Vacuum pump 618 is used to evacuate process chamber 610 and to maintain the pressure inside process chamber 610. Gas manifold 634, through which process gases are introduced into process chamber 610, is located above the substrate support pedestal 648. Gas manifold 634 is connected to a gas panel (not shown), which controls and supplies various process gases to process chamber 610.

Proper control and regulation of the gas flows to gas manifold 634 are performed by mass flow controllers (not shown) and microprocessor controller 670. Gas manifold 634 allows process gases to be introduced and uniformly distributed in process chamber 610. Additionally, gas manifold 634 may optionally be heated to prevent condensation of any reactive gases within the manifold.

Gas manifold 634 includes a plurality of electronic control valves (not shown). The electronic control valves as used herein refer to any control valve capable of providing rapid and precise gas flow to process chamber 610 with valve open and close cycles at a rate within a range from about 0.01 seconds to about 10 seconds, preferably from about 0.1 seconds to about 5 seconds, for example, a longer cycle may last about 3 seconds and a shorter cycle may last about 0.5 seconds.

Microprocessor controller 670 may be one of any form of general purpose computer processor (CPU) that can be used in an industrial setting for controlling various chambers and sub-processors. The computer may use any suitable memory, such as random access memory, read only memory, floppy disk drive, compact disc drive, hard disk, or any other form of digital storage, local or remote. Various support circuits may be coupled to the CPU for supporting the processor in a conventional manner. Software routines, as required, may be stored in the memory or executed by a remotely located source (e.g., computer or server).

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in the hardware, as an application specific integrated circuit or other type of hardware implementation or a combination of software or hardware.

Figure 7:
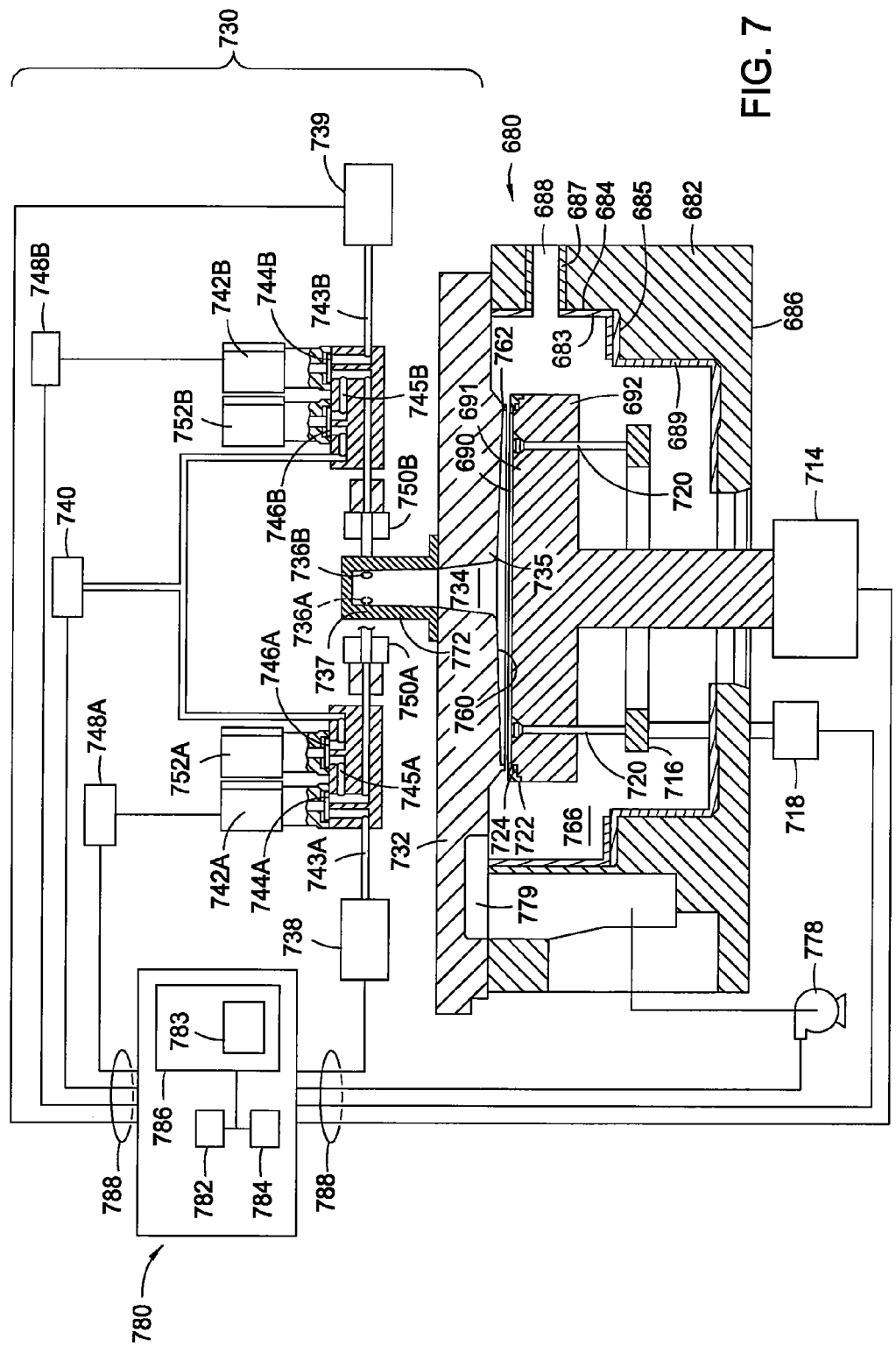
FIG. 7 depicts a schematic cross-sectional view of another process chamber that may be used during a deposition process according to an embodiment described herein.

FIG. 7 is a schematic cross-sectional view of one embodiment of process chamber 680 including gas delivery apparatus 730 adapted for cyclic deposition, such as atomic layer deposition or rapid chemical vapor deposition. A detailed description for process chamber 680 is described in commonly assigned U.S. patent Ser. No. 10/032,284, filed Dec. 21, 2001, entitled, "Gas Delivery Apparatus and Method for Atomic Layer Deposition," and published as US 20030079686 and commonly assigned U.S. patent Ser. No. 10/281,079, filed Oct. 25, 2002, entitled, "Gas Delivery Apparatus for Atomic Layer Deposition," and published as US 20030121608, which are both incorporated herein in their entirety by reference. The terms atomic layer deposition (ALD), rapid chemical vapor deposition and sequential vapor deposition as used herein refer to the sequential introduction of reactants or precursors to deposit a thin layer over a substrate structure. The sequential introduction of reactants may be repeated to deposit a plurality of thin layers to form a conformal layer to a desired thickness. In some embodiments, a reactant mixture containing more than one precursor (e.g., a hafnium precursor and a silicon precursor) may be sequentially pulsed with another precursor (e.g., water vapor). The process chamber 680 may also be adapted for other deposition techniques.

Process chamber 680 contains chamber body 682 having sidewalls 684 and bottom 686. Slit valve 688 in process chamber 680 provides access for a robot (not shown) to deliver and retrieve substrate 690, such as a semiconductor wafer with a diameter of 200 mm or 300 mm or a glass substrate, from process chamber 680.

Substrate support 692 supports substrate 690 on substrate receiving surface 691 in process chamber 680. Substrate support 692 is mounted to lift motor 714 to raise and lower substrate support 692 and substrate 690 disposed thereon. Lift plate 716 connected to lift motor 718 is mounted in process chamber 680 and raises and lowers pins 720 movably disposed through substrate support 692. Pins 720 raise and lower substrate 690 over the surface of substrate support 692. Substrate support 692 may include a vacuum chuck, an electrostatic chuck or a clamp ring for securing substrate 690 to substrate support 692 during a process.

Substrate support 692 may be heated to increase the temperature of substrate 690 disposed thereon. For example, substrate support 692 may be heated using an embedded heating element, such as a resistive heater, or may be heated using radiant heat, such as heating lamps disposed above substrate support 692. Purge ring 722 may be disposed on substrate support 692 to define purge channel 724 which provides a purge gas to a peripheral portion of substrate 690 to prevent deposition thereon.

Gas delivery apparatus 730 is disposed at an upper portion of chamber body 682 to provide a gas, such as a process gas and/or a purge gas, to process chamber 680. Vacuum system 778 is in communication with pumping channel 779 to evacuate any desired gases from process chamber 680 and to help maintain a desired pressure or a desired pressure range inside pumping zone 766 of process chamber 680.

In one embodiment, process gas and/or purge gas enters process chamber 680 normal (i.e., 90°) with respect to the plane of substrate 690 via gas delivery apparatus 730. Therefore, the surface of substrate 690 is symmetrically exposed to gases that allow uniform film formation on substrates. The process gas may include a hafnium-containing compound (e.g., TDEAH or $HfCl_4$) during one pulse and an oxidizing gas (e.g., water vapor derived from a WVG system) in another pulse.

Process chamber 680, depicted in FIG. 7, may produce a more uniform film than chamber 610, depicted in FIG. 6. Also, process chamber 680 employs a smaller cycle time than process chamber 610, since process chamber 680 usually takes less time to purge and less time to saturate a substrate with precursor than process chamber 610. Therefore, process chambers 610 and 680 may dose a hafnium-containing compound for about 20 seconds or less, preferably process chamber 680 may dose the hafnium-containing compound for about 10 seconds or less, more preferably for about 5 seconds or less, for example, about 3 seconds or about 0.5 seconds.

In one embodiment, gas delivery apparatus 730 comprises chamber lid 732. Chamber lid 732 includes expanding channel 734 extending from a central portion of chamber lid 732 and bottom surface 760 extending from expanding channel 734 to a peripheral portion of chamber lid 732. Bottom surface 760 is sized and shaped to substantially cover substrate 690 disposed on substrate support 692. Chamber lid 732 may have choke 762 at a peripheral portion of chamber lid 732 adjacent the periphery of substrate 690. Cap portion 772 includes a portion of expanding channel 734 and gas inlets 736A, 736B. Expanding channel 734 has gas inlets 736A, 736B to provide gas flows from two similar valves 742A, 742B. The gas may be provided together and/or separately from valves 742A, 742B.

In one embodiment, chamber lid 732 is made from a metallic material such as stainless steel (e.g., iron-chromium alloys optionally containing nickel), aluminum, derivatives thereof, alloys thereof or combinations thereof. In an alternative embodiment, chamber lid 732 contains a thermally insulating material, such as fused quartz, sapphire, pyrolytic boron nitride (PBN) material, ceramic, derivatives thereof or combinations thereof. In one example, a thermally insulating liner is added to chamber lid 732 covering a substantial portion of expanding channel 734 and bottom surface 760 (not shown). Preferably, expanding channel 734 and bottom surface 760 may be machined into chamber lid 732 composed of a thermally insulating material. Additional liners made from the same or a similar thermally insulating material may be added within process chamber 680. In one example, slit valve 688 contains liner 687, side walls 684 contain liner 683 and bottom surfaces 685 contains liner 689.

In one configuration, valve 742A and valve 742B are coupled to separate reactant gas sources but are preferably coupled to the same purge gas source. For example, valve 742A is coupled to reactant gas source 738 and valve 742B is coupled to reactant gas source 739, and both valves 742A, 742B are coupled to purge gas source 740. Valves 742A, 742B each include delivery line 743A, 743B having valve seat assembly 744A, 744B and includes purge line 745A, 745B having valve seat assembly 746A, 746B in fluid with valves 752A, 752B. Delivery line 743A, 743B is in fluid communication with reactant gas source 738, 739 and is in fluid communication with gas inlets 736A, 736B of expanding channel 734. Additional reactant gas sources, delivery lines, gas inlets and valves may be added to gas delivery apparatus 730 in alternative embodiments (not shown). Valve seat assembly 744A, 744B of delivery line 743A, 743B controls the flow of the reactant gas from reactant gas sources 738, 739 to expanding channel 734. Purge line 745A, 745B is in fluid communication with purge gas source 740 and intersects delivery line 743A, 743B downstream of valve seat assembly 744A, 744B of delivery line 743A, 743B. Valve seat assembly 746A, 746B of purge line 745A, 745B controls the flow of the purge gas from purge gas source 740 to delivery line 743A, 743B. If a carrier gas is used to deliver reactant gases from reactant gas source 738, 739, the same gas may be used as a carrier gas and a purge gas (e.g., nitrogen used as a carrier gas and a purge gas).

Each valve seat assembly 744A, 744B, 746A, 746B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujikin and Veriflow. Examples of electrically actuated valves include electrically actuated valves available from Fujikin. Programmable logic controllers 748A, 748B may be coupled to valves 742A, 742B to control actuation of the diaphragms of valve seat assemblies 744A, 744B, 746A, 746B of valves 742A, 742B. Pneumatically actuated valves may provide pulses of gases in time periods as low as about 0.020 seconds. Electrically actuated valves may provide pulses of gases in time periods as low as about 0.005 seconds. Generally pneumatically and electrically actuated valves may provide pulses of gases in time periods as high as about 3 seconds. Although higher time period for gas pulsing is possible, a typical ALD process utilizes ALD valves to generate pulses of gas while being opened for an interval of about 5 seconds or less, preferably about 3 seconds or less, and more preferably about 2 seconds or less. In one embodiment, an ALD valve pulses for an interval in a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and the programmable logic controller.

Each valve 742A, 742B may be a zero dead volume valve to enable flushing of a reactant gas from delivery line 743A, 743B when valve seat assembly 744A, 744B of the valve is closed. For example, purge line 745A, 745B may be positioned adjacent valve seat assembly 744A, 744B of delivery line 743A, 743B. When valve seat assembly 744A, 744B is closed, purge line 745A, 745B may provide a purge gas to flush delivery line 743A, 743B. In one embodiment, warmed purge gas (e.g., about 50° C. to about 200° C.) is passed through to heat valve set assembly 744A, 744B in order to diminish or stop the condensation of precursors thereon, as well as within delivery lines 743A, 743B. In the embodiment shown, purge line 745A, 745B is positioned slightly spaced from valve seat assembly 744A, 744B of delivery line 743A, 743B so that a purge gas is not directly delivered into valve seat assembly 744A, 744B when open. A zero dead volume valve as used herein is defined as a valve which has negligible dead volume (i.e., not necessary zero dead volume).

Each valve 742A, 742B may be adapted to provide a combined gas flow and/or separate gas flows of reactant gas 738, 739 and purge gas 740. In reference to valve 742A, one example of a combined gas flow of reactant gas 738 and purge gas 740 provided by valve 742A comprises a continuous flow of a purge gas from purge gas source 740 through purge line 745A and pulses of a reactant gas from reactant gas source 738 through delivery line 743A. The continuous flow of the purge gas may be provided by opening the diaphragm of valve seat assembly 746A of purge line 745A. The pulses of the reactant gas from reactant gas source 738 may be provided by opening and closing the diaphragm of valve seat 744A of delivery line 743A. In reference to valve 742A, one example of separate gas flows of reactant gas 738 and purge gas 740 provided by valve 742A comprises pulses of a purge gas from purge gas source 740 through purge line 745A and pulses of a reactant gas from reactant gas source 738 through delivery line 743A. The pulses of the purge gas may be provided by opening and closing the diaphragm of valve seat assembly 746A of purge line 745A. The pulses of the reactant gas from reactant gas source 738 may be provided by opening and closing diaphragm valve seat 744A of delivery line 743A.

Delivery lines 743A, 743B of valves 742A, 742B may be coupled to gas inlets 736A, 736B through gas conduits 750A, 750B. Gas conduits 750A, 750B may be integrated or may be separate from valves 742A, 742B. In one aspect, valves 742A, 742B are coupled in close proximity to expanding channel 734 to reduce any unnecessary volume of delivery line 743A, 743B and gas conduits 750A, 750B between valves 742A, 742B and gas inlets 736A, 736B.

In FIG. 7, expanding channel 734 comprises a channel which has an inner diameter which increases from an upper portion to a lower portion of expanding channel 734 adjacent bottom surface 760 of chamber lid 732. In one specific embodiment, the inner diameter of expanding channel 734 for a chamber adapted to process 200 mm diameter substrates is between about 0.2 inches (0.51 cm) and about 1.0 inches (2.54 cm), preferably between about 0.3 inches (0.76 cm) and about 0.9 inches (2.29 cm) and more preferably between about 0.3 inches (0.76 cm) and about 0.5 inches (1.27 cm) at upper portion 737 of the expanding channel 734 and between about 0.5 inches (1.27 cm) and about 3.0 inches (7.62 cm), preferably between about 0.75 inches (1.91 cm) and about 2.5 inches (6.35 cm) and more preferably between about 1.1 inches (2.79 cm) and about 2.0 inches (5.08 cm) at lower portion 735 of expanding channel 734.

In another specific embodiment, the inner diameter of expanding channel 734 for a chamber adapted to process 300 mm diameter substrates is between about 0.2 inches (0.51 cm) and about 1.0 inches (2.54 cm), preferably between about 0.3 inches (0.76 cm) and about 0.9 inches (2.29 cm) and more preferably between about 0.3 inches (0.76 cm) and about 0.5 inches (1.27 cm) at upper portion 737 of the expanding channel 734 and between about 0.5 inches (1.27 cm) and about 3.0 inches (7.62 cm), preferably between about 0.75 inches (1.91 cm) and about 2.5 inches (6.35 cm) and more preferably between about 1.2 inches (3.05 cm) and about 2.2 inches (5.59 cm) at lower portion 735 of expanding channel 734 for a 300 mm substrate. In general, the above dimension apply to an expanding channel adapted to provide a total gas flow rate in a range from about 500 sccm to about 3,000 sccm.

In other specific embodiments, the dimension may be altered to accommodate a certain gas flow therethrough. In general, a larger gas flow will require a larger diameter expanding channel. In one embodiment, expanding channel 734 may be shaped as a truncated cone (including shapes resembling a truncated cone). Whether a gas is provided toward the walls of expanding channel 734 or directly downward towards the substrate, the velocity of the gas flow decreases as the gas flow travels through expanding channel 734 due to the expansion of the gas. The reduction of the velocity of the gas flow helps reduce the likelihood the gas flow will blow off reactants absorbed on the surface of substrate 690.

Not wishing to be bound by theory, it is believed that the diameter of expanding channel 734, which is gradually increasing from upper portion 737 to lower portion 735 of expanding channel 734, allows less of an adiabatic expansion of a gas through expanding channel 734 which helps to control the temperature of the gas. For instance, a sudden adiabatic expansion of a gas delivered through gas inlet 736A, 736B into expanding channel 734 may result in a drop in the temperature of the gas which may cause condensation of the precursor vapor and formation of particles. On the other hand, a gradually expanding channel 734 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid 732). The gradually expanding channel 734 may comprise one or more tapered inner surfaces, such as a tapered straight surface, a concave surface, a convex surface, or combinations thereof or may comprise sections of one or more tapered inner surfaces (i.e., a portion tapered and a portion non-tapered).

In one embodiment, gas inlets 736A, 736B are located adjacent upper portion 737 of expanding channel 734. In other embodiments, one or more gas inlets 736A, 736B may be located along the length of expanding channel 734 between upper portion 737 and lower portion 735. Not wishing to be bound by theory, gas flowing from gas inlets 736A, 736B into and through expanding channel 734 of chamber lid 732 forms a circular flow. Although the exact flow pattern through expanding channel 734 is not known, it is believed that the circular flow may travel with a flow pattern such as a vortex flow, a helix flow, a spiral flow or derivative thereof through expanding channel 734. The circular flow may be provided in a processing region located between lower portion 735 and substrate receiving surface 691 as opposed to in a compartment separated from substrate 690. In one aspect, the vortex flow may help to establish a more efficient purge of expanding channel 734 due to the sweeping action of the circular flow across the inner surface of expanding channel 734. Also, a circular gas flow provides a consistent and conformal delivery of gas across the surface of substrate 690.

In FIG. 7, control unit 780, such as a programmed personal computer, work station computer, or the like, may be coupled to process chamber 680 to control processing conditions. For example, control unit 780 may be configured to control flow of various process gases and purge gases from gas sources 738, 739, 740 through valves 742A, 742B during different stages of a substrate process sequence. Illustratively, control unit 780 comprises central processing unit (CPU) 782, support circuitry 784, and memory 786 containing associated control software 783. Control unit 780 may also be configured to control WVG system 286 and/or regulate ampoule 282.

Control unit 780 may be one of any form of general purpose computer processor that can be used in an industrial setting for controlling various chambers and sub-processors.

CPU 782 may use any suitable memory 786, such as random access memory, read only memory, floppy disk drive, compact disc drive, hard disk, or any other form of digital storage, local or remote. Various support circuits may be coupled to CPU 782 for supporting process chamber 680. Control unit 780 may be coupled to another controller that is located adjacent individual chamber components, such as programmable logic controllers 748A, 748B of valves 742A, 742B. Bi-directional communications between control unit 780 and various other components of process chamber 680 are handled through numerous signal cables collectively referred to as signal buses 788, some of which are illustrated in FIG. 7. In addition to control of process gases and purge gases from gas sources 738, 739, 740 and from the programmable logic controllers 748A, 748B of valves 742A, 742B, control unit 780 may be configured to be responsible for automated control of other activities used in wafer processing, such as wafer transport, temperature control, chamber evacuation, among other activities, some of which are described elsewhere herein.

In another embodiment, process chamber 680 may be adapted to receive three or more gas flows together, partially together (i.e., two of three gas flows together) or separately through three or more gas inlets from connected to three or more gas conduits. Each conduit is coupled to a single or plurality of valves. Further disclosure of process chamber 680 adapted to flow three or more process gas flows is described in commonly assigned U.S. patent Ser. No. 10/032,284, filed Dec. 21, 2001, entitled, "Gas Delivery Apparatus and Method for Atomic Layer Deposition," and published as US 20030079686, which is incorporated herein by reference. In one example, the three gas flows may contain a hafnium precursor, a silicon precursor and an oxidizing gas, where, the first flow includes TDEAH, TDMAH or $HfCl_4$, the second flow includes TDMAS, Tris-DMAS or silane and the third flow includes an oxidizing gas containing water vapor from a WVG system.

Figure 8:
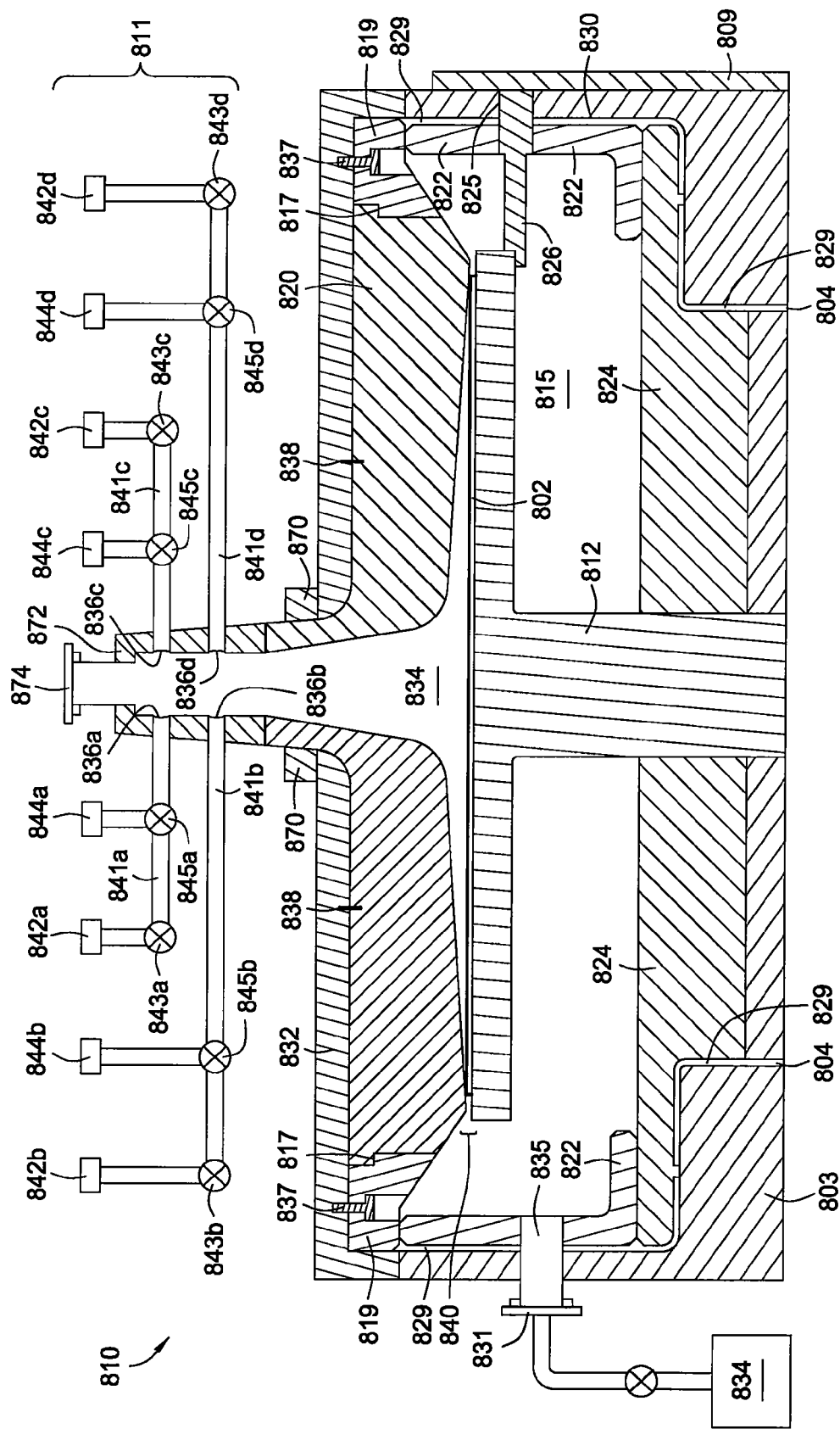
FIG. 8 depicts a schematic cross-sectional view of another process chamber that may be used during a deposition process according to an embodiment described herein.

FIG. 8 depicts a schematic cross-sectional view of process chamber 810 that may be used to perform integrated circuit fabrication in accordance with embodiments described herein. Process chamber 810 is similar in function to process chamber 680 and contains thermally insulating materials to operate at high temperatures (e.g., <800° C.). The process chamber 810 contains liners made from a thermally insulating material, such as fused quartz, sapphire, pyrolytic boron nitride (PBN) material, ceramic, derivatives thereof or combinations thereof. In one embodiment, the gas delivery apparatus 730 from process chamber 680 may be adapted to be used on process chamber 810.

Process chamber 810 generally houses substrate support pedestal 812, which is used to support substrate 802. Substrate support pedestal 812 is rotatable and vertically movable within process chamber 810. Substrate support pedestal 812 may contain a heating element to control the temperature of substrate 802 thereon. Cap portion 872 is disposed on lid 832 of process chamber 810 and contains gas inlets 836a, 836b, 836c and 836d. Cap portion 872 may also contain adapter 874 for a microwave apparatus or a remote plasma apparatus used during a plasma process, such as a PE-ALD process, a pre-clean process or a nitridation process. Alternatively, adapter 874 is absent from cap portion 872.

Gas delivery system 811 is connected to process chamber 810 through cap portion 872. Gas delivery system 811 contains at least one and as many as about ten componential sets of gas inlet 836, conduit system 841, valve 843 and/or valve 845 and source 842 and/or source 844. As illustrated in FIG. 8, gas delivery system 811 contains four componential sets containing gas inlets 836a, 836b, 836c and 836d, conduit systems 841a, 841b, 841c and 841d, valves 843a, 843b, 843c and 843d, valves 845a, 845b, 845c and 845d, sources 842a, 842b, 842c, 842d, and sources 844a, 844b, 844c and 844d.

In an alternative embodiment, conduit system 841 may further contain gradually expanding gas conduits forming nozzles at the ends that are also positioned in fluid communication with gas inlets 836a, 836b, 836c and 836d. The nozzles or ends that are useful in some embodiments described herein are further described in commonly assigned U.S. patent Ser. No. 11/119,388, filed Apr. 29, 2005, entitled, "Control of Gas Flow and Delivery to Suppress the Formation of Particles in an MOCVD/ALD System," which is incorporated herein by reference to support disclosure of the gradually expanding gas conduits. The gas conduit geometry prevents large temperature drops by providing passing gases a means to gradually expand through an increasing tapered flow channel. In one embodiment, the flow channel transitions from the cross-sections of delivery gas lines with internal diameter in a range from about 3 mm to about 15 mm to gas inlet 836 with a larger diameter in a range from about 10 mm to about 20 mm over a distance in a range from about 30 mm to about 100 mm. A gradual increase of the diameter of a flow channel allows the expanding gases to be in near equilibrium and prevents a rapid lost of heat to maintain a substantially constant temperature. Expanding gas conduits may comprise one or more tapered inner surfaces such as a tapered straight surface, a concave surface, a convex surface, derivatives thereof or combinations thereof or may comprise sections of one or more tapered inner surfaces (e.g., a portion tapered and a portion non-tapered).

Conduit system 841 contains one or several conduits and tubes connecting gas inlets 836, valves 843 and 845 and sources 842 and 844. Valve 843 controls the introduction of precursors or gases from source 842 to gas inlet 836 and valve 845 controls the introduction of precursors or gases from source 844 to gas inlet 836. Valves 843 and 845 may include a valve and a valve seat assembly containing a diaphragm and a valve seat. Pneumatically actuated valves may provide pulses of gases in time periods as low as about 0.020 seconds. Electrically actuated valves may provide pulses of gases in time periods as low as about 0.005 seconds. Generally, pneumatically and electrically actuated valves may provide pulses of gases in time periods as high as about 3 seconds. Although higher time period for gas pulsing is possible, a typical ALD process utilizes ALD valves that generate pulses of gas while being opened for an interval of about 5 seconds or less, preferably about 3 seconds or less, and more preferably about 2 seconds or less. In one embodiment, an ALD valve pulses for an interval in a range from about 0.005 seconds to about 3 seconds, preferably from about 0.02 seconds to about 2 seconds and more preferably from about 0.05 seconds to about 1 second. An electrically actuated valve typically requires the use of a driver coupled between the valve and the programmable logic controller. A control unit (not shown), such as a programmed personal computer, work station computer, or the like, may be included with process chamber 810, including valves 843 and 845, sources 842 and 844, vacuum system 833, substrate support 812, WVG system 286 and ampoule 282 to control processing conditions as described herein.

Sources 842 and 844 may provide a precursor source, a purge gas source and/or a carrier gas source used during the deposition process. A precursor source may include more than one chemical precursor (e.g., a hafnium precursor and a silicon precursor) and may include a carrier gas. A precursor source includes ampoules, bubblers, tanks, containers or cartridges. Also, a precursor source includes a water vapor generator (WVG) system in fluid communication with gas delivery system 811 as described herein. A purge gas source and/or a carrier gas source usually a tank, a container, a cartridge or an in-house plumbed supply system, may provide nitrogen, argon, helium, hydrogen, forming gas or combinations thereof to gas delivery system 811.

Gas inlets 836a, 836b, 836c and 836d may be located along the length of expanding channel 834 within cap portion 872. Not wishing to be bound by theory, gas flowing from gas inlets 836a, 836b, 836c and 836d into and through expanding channel 834 forms a circular flow. Although the exact flow pattern through expanding channel 834 is not known, it is believed that the circular flow may travel with a flow pattern such as a vortex flow, a helix flow, a spiral flow or derivative thereof through the expanding channel 834. The circular flow may be provided in a processing region located between funnel liner 820 and substrate support 812 as opposed to in a compartment separated from substrate 802. In one aspect, the vortex flow may help to establish a more efficient purge of the processing region due to the sweeping action of the circular flow across the inner surface of expanding channel 834. Also, a circular gas flow provides a consistent and conformal delivery of gas across the surface of substrate 802.

Figure 9A:
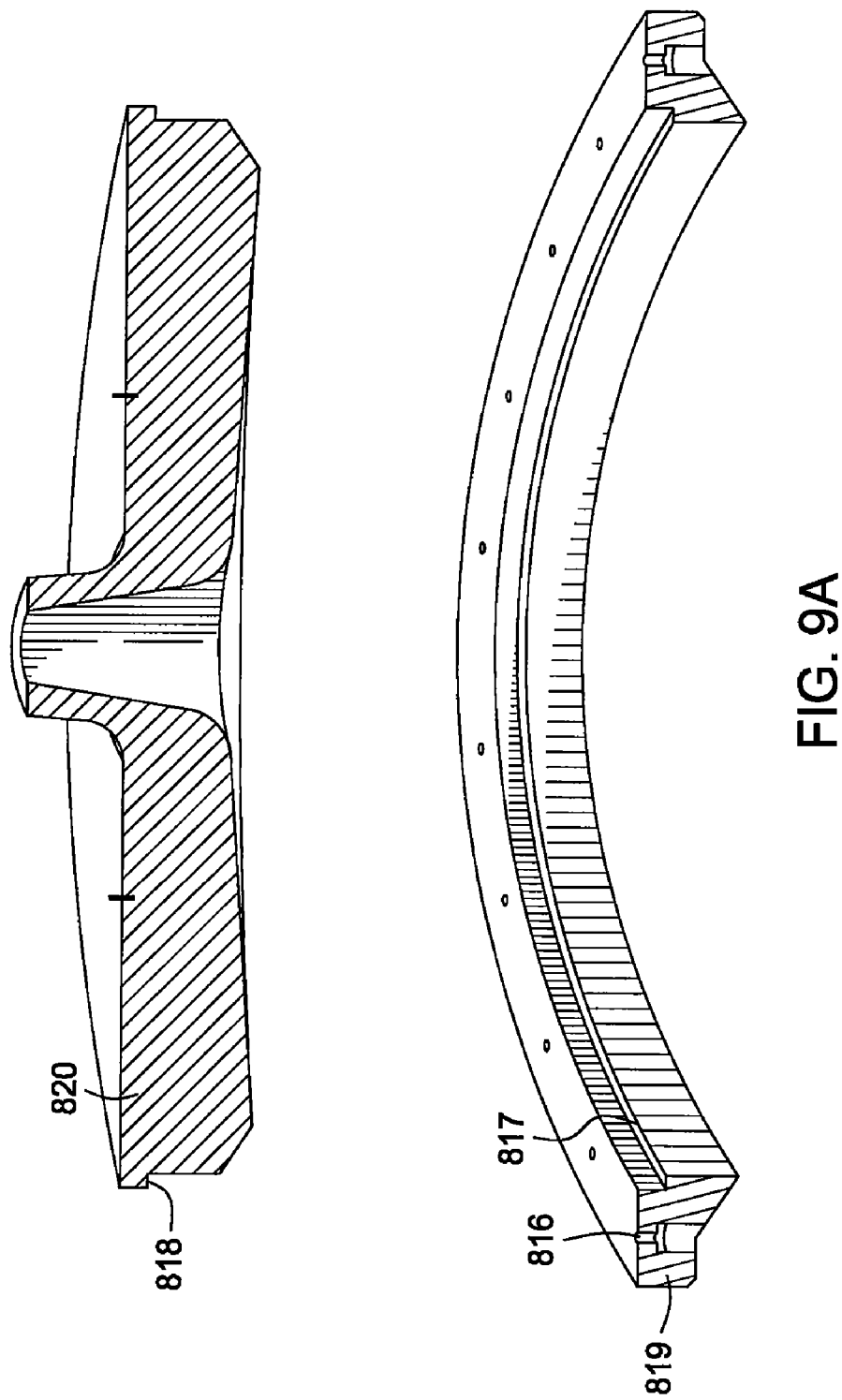
FIGS. 9A-9B depict schematic views of thermally insulating liners that may be used with the process chambers according to embodiments described herein.
Figure 9B:
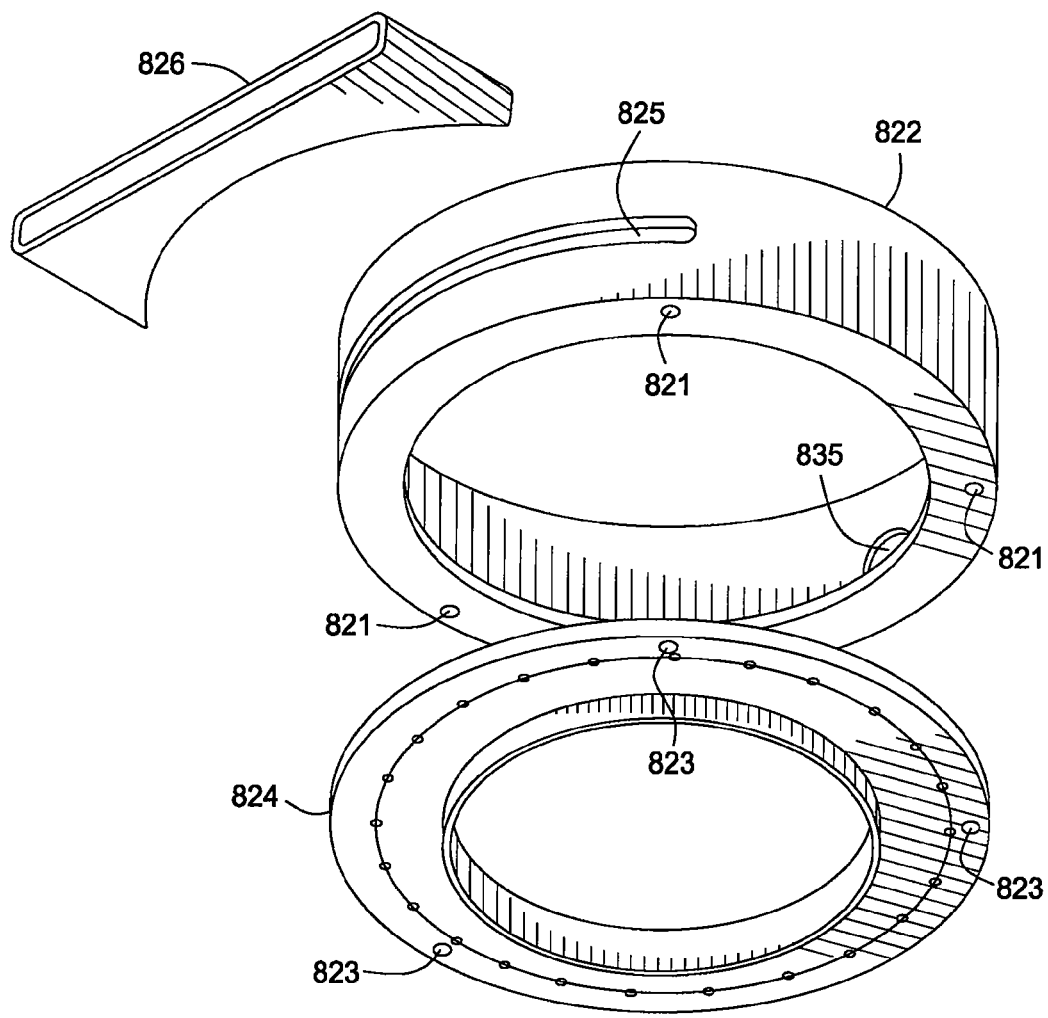

FIGS. 8 and 9A-9B depict schematic views of thermally insulating liners that may be used within process chamber 810 and other process chambers during deposition processes described herein. Expanding channel 834 may be formed within cap portion 872 and between funnel liner 820. Thermal isolator 870 is disposed around cap portion 872. Funnel liner 820 may be held against to the underside of lid 832 by retaining ring liner 819 by aligning ledge surface 817 of retaining ring liner 819 with ledge surface 818 of funnel liner 820. Retaining ring liner 819 may be attached to the underside of lid 832 by fasteners 837, such as fittings, bolts, screws or pins. In one example, fastener 837 is a fitting inserted and set into groove 816 of retaining ring liner 819. Funnel liner 820 may also contain several pins 838 that are loosely fitted to provide the funnel liner 820 freedom to thermally expand while under a heating process. In one embodiment, funnel liner 820 becomes aligned and centered with substrate 802 after being thermally expanded. Alternatively, funnel liner 820 and retaining ring liner 819 may be formed as a single piece.

Process chamber 810 may further contain upper process liner 822 and lower process liner 824. Lower process liner 824 is disposed on bottom surface 827 and upper process liner 822 is disposed on lower process liner 824 and along wall surface 830 of chamber body 803. Slip valve liner 826 is positioned to protrude through upper process liner 822 and into process region 815. Liners including funnel liner 820, retaining ring liner 819, upper process liner 822, lower process liner 824 and slip valve liner 826 are thermally insulating material, such as fused quartz, sapphire, PBN material, ceramic, derivatives thereof or combinations thereof. Generally, the liners are stressed relieved to prevent failure to thermal cycling during start-up and cool-down cycles of the deposition processes described herein. The liners are capable of withstanding temperatures of about 800° C. or higher, preferably about 1,000° C. or higher, more preferably about 1,200° C. or higher. Additionally, the liners are flame polished to achieve a surface finish of about 2 microinches (about 0.051 μm) or less. The polished finish provides a smooth surface so that process reactants are delivered with little or no turbulence, as well as minimizes nucleation sites on the liners that may undesirably promote film growth thereon. Also, flame polishing removes surface flaws (e.g., pits and cracks) to minimize the nucleation of thermal stress-induced cracks.

Purge line 829 is a chamber back side purge line disposed from the bottom of chamber body 803 to chamber lid 832 and funnel liner 820. Purge line 829 is situated to allow a flow of purge gas between wall surface 830 and upper/lower process liners 822 and 824 and into process region 815. A source of purge gas may be connected to purge line 829 through inlets 804. Purge gas flowing through purge line 826 buffers wall surface 830 from contaminants and excessive heat that may escape process region 815. Contaminants include precursors or reaction products that may by-pass upper/lower process liners 822 and 824 to deposit on wall surface 830. Also, heat originating from process region 815 may evade upper/lower process liners 822 and 824 and absorb into process body 803. However, a stream of purge gas flowing through purge line 826 transports contaminants and heat back into process region 815. Thermal choke plate 809 is disposed on the outside of chamber body 803 to prevent heat loss from process region 815.

FIG. 9B depicts a schematic view of upper process liner 822, lower process liner 824 and slip valve liner 826. Upper process liner 822 and lower process liner 824 may contain lift pin holes 821 and 823 to accept substrate lift pins (not shown) during movement of substrate 802. Upper process liner 822 and lower process liner 824 are positioned within the process chamber to align lift pin holes 821 with lift pin holes 823. Upper process liner 822 further contains vacuum port 835 accept exhaust adaptor 831 and slit valve port 825 to accept slip valve liner 826. Exhaust adaptor 831 is positioned through chamber body 803 and vacuum port 835 so that process region 815 is in fluid communication with vacuum system 833. Substrates pass through slip valve liner 826 to enter and exit process chamber 810. Slip valve liner 826 may also protrude through thermal choke plate 809.

Pumping efficiency may be controlled by using choke gap 840. Choke gap 840 is a space formed between the bottom edge of funnel liner 820 and top of substrate support pedestal 812. Choke gap 840 is a circumferential gap that may be varied depending on the process conditions and the required pumping efficiency. Choke gap 840 is increased by lowering substrate support pedestal 812 or decreased by raising substrate support pedestal 812. The pumping conductance from the pumping port (not shown) in the lower portion of process chamber 810 to the center of expanding channel 834 is modified by changing the distance of choke gap 840 to control the thickness and the uniformity of a film during deposition processes described herein.

Figure 10:
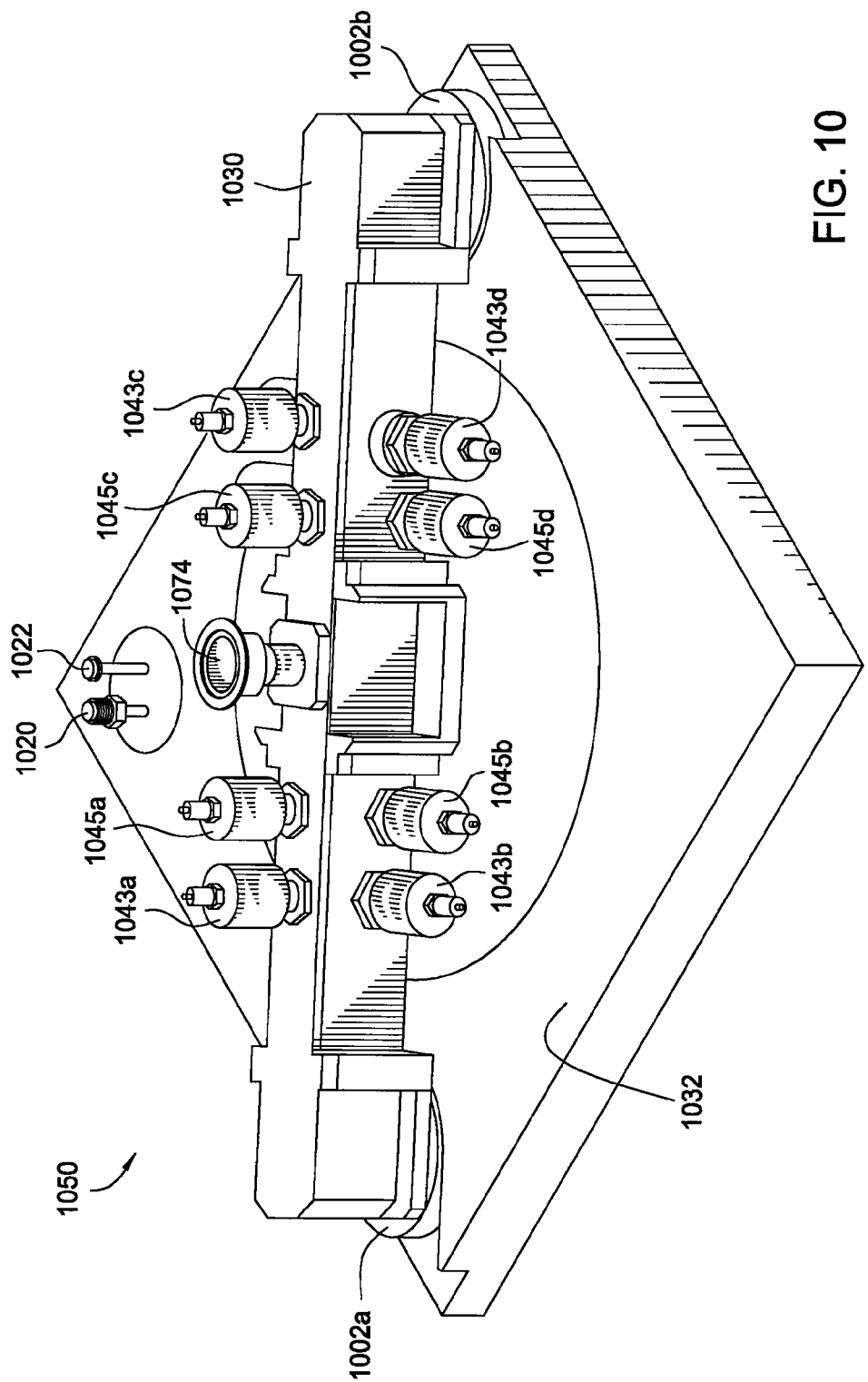
FIG. 10 depicts a schematic view of process chamber lid assembly that may be used during a deposition process according to an embodiment described herein.

FIG. 10 depicts a schematic view of process chamber lid assembly 1050 that may be used on the ALD process chambers described herein. In one example, lid assembly 1050 may replace lid 832 and gas delivery system 811 on process chamber 810. In another example, lid assembly 1050 may replace lid 732 and gas delivery apparatus 730 on process chamber 680. Lid assembly 1050 contains valve manifold support 1030 disposed on lid 1032. Thermal isolators 1002a and 1002b separate valve manifold support 1030 from lid 1032 and any heat dissipating therefrom. Conduits 1020 and 1022 traverse through lid 1032 to provide fluid communication from external sources or devices into the process chamber. Valve manifold support 1030 contains adapter 1074, valves 1043a, 1043b, 1043c and 1043d and valves 1045a, 1045b, 1045c and 1045d. Adapter 1074 supports a microwave apparatus or a remote plasma apparatus used during a plasma process, such as a PE-ALD process, a pre-clean process or a nitridation process. Valves 1043a, 1043b, 1043c and 1043d and valves 1045a, 1045b, 1045c and 1045d are connected by a conduit system (not shown) within valve manifold support 1030. Precursor sources, purge gas sources and/or carrier gas sources are in fluid communication with a process chamber through lid assembly 1050 during a deposition process. In one example, lid assembly 1050 is plumbed with a conduit system similar to conduit system 841 within gas delivery system 811.

A "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Processes of the embodiments described herein deposit hafnium-containing materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pre-treatment process to polish, etch, reduce, oxidize, hydroxylate, anneal and/or bake the substrate surface.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a process chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B and a third precursor containing compound C are each separately pulsed into the process chamber. Alternatively, a pulse of a first precursor may overlap in time with a pulse of a second precursor while a pulse of a third precursor does not overlap in time with either pulse of the first and second precursors.

EXAMPLES

During Examples 1-10, the ALD processes are maintained at a temperature in a range from about 70° C. to about 1,000° C., preferably from about 100° C. to about 650° C., for example, about 350° C. The ALD processes may be conducted having the process chamber at a pressure in the range from about 0.1 Torr to about 100 Torr, preferably from about 1 Torr to about 10 Torr. A carrier gas (e.g., $N_2$) may have a flow rate in the range from about 2 slm to about 22 slm, preferably about 10 slm. An oxidizing gas containing water vapor was produced by a water vapor generator (WVG) system containing a metal catalyst, available from Fujikin of America, Inc., located in Santa Clara, Calif. The WVG system formed the oxidizing gas from a hydrogen source gas and an oxygen source gas. The substrates were exposed to an oxidizing gas containing water vapor from the WVG system for about during a pre-treatment process. The pre-treatment process occurred for a period in a range from about 5 seconds to about 30 seconds. Deposited materials were formed with a thickness in the range from about 2 Å to about 1,000 Å, preferably, from about 5 Å to about 100 Å, and more preferably, from about 10 Å to about 50 Å.

Example 1

A hafnium oxide film is formed during an ALD process by sequentially pulsing a hafnium precursor with an oxidizing gas produced by a WVG system. A substrate surface is exposed to a pretreatment process to form hydroxyl groups thereon. The hafnium precursor, $HfCl_4$, is heated within a precursor ampoule at a temperature in a range from about 150° C. to about 200° C. A nitrogen carrier gas is directed into the precursor ampoule containing the hafnium precursor with a flow rate of about 400 sccm. The hafnium precursor saturates the carrier gas and is provided into the chamber for about 3 seconds. A purge gas of nitrogen is provided into the chamber for about 2.5 seconds to remove any unbound hafnium precursor. Hydrogen gas and oxygen gas with the flow rate of about 100 sccm and about 120 sccm respectively, are supplied to the WVG system. The oxidizing gas coming from the WVG system contains water with a flow rate of about 100 sccm and oxygen with a flow rate of about 70 sccm. The oxidizing gas is provided into the chamber for about 1.7 seconds. The purge gas of nitrogen is provided into the chamber for about 2.5 seconds to remove any unbound or non-reacted reagents, such as byproducts, hafnium precursor, oxygen and/or water or any by-products such as HCl. Each ALD cycle forms about 1 Å of a hafnium oxide film.

Example 2

A hafnium oxide film is formed during an ALD process by sequentially pulsing a hafnium precursor with an oxidizing gas. A substrate surface is exposed to a pretreatment process to form hydroxyl groups thereon. The hafnium precursor, $HfCl_4$, is heated within a precursor ampoule at a temperature in a range from about 150° C. to about 200° C. A nitrogen carrier gas is directed into the precursor ampoule containing the hafnium precursor with a flow rate of about 400 sccm. The hafnium precursor saturates the carrier gas and is provided into the chamber for about 0.5 seconds. A purge gas of nitrogen is provided into the chamber for about 0.5 seconds to remove any unbound hafnium precursor. Hydrogen gas and oxygen gas with the flow rate of about 50 sccm and about 60 sccm respectively, are supplied to the WVG system. The oxidizing gas coming from the WVG system contains water with a flow rate of about 50 sccm and oxygen with a flow rate of about 35 sccm. The oxidizing gas is provided into the chamber for about 0.5 seconds. The purge gas of nitrogen is provided into the chamber for about 0.5 seconds to remove any unbound or non-reacted reagents, such as hafnium precursor, oxygen and/or water or any by-products, such as HCl. Each ALD cycle forms about 2.5 Å of a hafnium oxide film.

Example 3

A hafnium silicate film is formed during with an ALD process by sequentially pulsing a hafnium precursor with an oxidizing gas followed by pulsing a silicon precursor with the oxidizing gas. A substrate surface is exposed to a pretreatment process to form hydroxyl groups thereon. The hafnium precursor, TDEAH, and silicon precursor, TDMAS, are heated within separate precursor ampoules at room temperature (about 23° C.). These precursors are vaporized individually in vaporizers at about 110° C. to about 130° C. and individually mixed with an inert carrier gas. The hafnium precursor saturates the carrier gas and is provided into the chamber for about 1 second. A purge gas of nitrogen is provided into the chamber for about 1 second to remove any unbound hafnium precursor. Hydrogen gas and oxygen gas with the flow rate of about 100 sccm and about 120 sccm respectively, are supplied to the WVG system. The oxidizing gas coming from the WVG system contains water with a flow rate of about 100 sccm and oxygen with a flow rate of about 70 sccm. The oxidizing gas is provided into the chamber for about 1.7 seconds. The purge gas of nitrogen is provided into the chamber for 5 seconds to remove any unbound or non-reacted reagents, such as hafnium precursor, oxygen and/or water or by-products. A silicon precursor is provided into the chamber for about 1 second. A purge gas of nitrogen is provided into the chamber for about 1 second to remove any unbound precursor or contaminant. The oxidizing gas is provided into the chamber for about 1.7 seconds. The purge gas of nitrogen is provided into the chamber for about 5 seconds. Each ALD cycle forms about 1 Å of a hafnium silicate film.

Example 4

A hafnium silicate film is formed during with an ALD process by sequentially pulsing a hafnium precursor with oxidizing gas followed by pulsing a silicon precursor with the oxidizing gas. A substrate surface is exposed to a pretreatment process to form hydroxyl groups thereon. The hafnium precursor, $HfCl_4$, and silicon precursor, Tris-DMAS, are heated within separate precursor ampoules at room temperature (about 23° C.). These precursors are vaporized individually in vaporizers at about 110° C. to about 130° C. and individually mixed with an inert carrier gas. The hafnium precursor saturates the carrier gas and is provided into the chamber for about 1 second. A purge gas of nitrogen is provided into the chamber for about 1 second. Hydrogen gas and oxygen gas with the flow rate of about 100 sccm and about 120 sccm respectively, are supplied to the WVG system. The oxidizing gas coming from the WVG system contains water with a flow rate of about 100 sccm of water and oxygen with a flow rate of about 70 sccm. The oxidizing gas is provided into the chamber for about 1.7 seconds. The purge gas of nitrogen is provided into the chamber for about 1 second to remove any unbound or non-reacted reagents, such as hafnium precursor, oxygen and/or water. A silicon precursor is provided into the chamber for about 1 second. A purge gas of nitrogen is provided into the chamber for about 1 second to remove any unbound precursor or contaminant. The oxidizing gas is precursor into the chamber for about 1.7 seconds. The purge gas of nitrogen is precursor into the chamber for about 5 seconds. Each ALD cycle forms about 1 Å of a hafnium silicate film.

Example 5

A hafnium silicate film is formed during with an ALD process by simultaneously pulsing a hafnium precursor and a silicon precursor sequentially with oxidizing gas. A substrate surface is exposed to a pretreatment process to form hydroxyl groups thereon. The hafnium precursor, TDEAH, and silicon precursor, TDMAS, are heated within separate precursor ampoules at room temperature (about 23° C.). These precursors are vaporized individually in vaporizers at about 110° C. to about 130° C. and individually mixed with an inert carrier gas. The hafnium precursor and the silicon precursor are each simultaneously provided into the chamber for about 1 second. A purge gas of nitrogen is provided into the chamber for about 1 second to remove any unbound hafnium or silicon precursors. Hydrogen gas and oxygen gas with the flow rate of about 100 sccm and about 120 sccm respectively, are supplied to the WVG system. The oxidizing gas comes from the WVG system contains water with a flow rate of about 100 sccm and oxygen with a flow rate of about 70 sccm. The oxidizing gas is provided into the chamber for about 1.7 seconds. The purge gas of nitrogen is provided into the chamber for about 5 seconds to remove any unbound or non-reacted reagents, such as byproducts, hafnium precursor, silicon precursor, oxygen and/or water. Each ALD cycle forms about 1 Å of a hafnium silicate film.

Example 6

A hafnium silicate film is formed during with an ALD process by simultaneously pulsing a hafnium precursor and a silicon precursor sequentially with oxidizing gas. A substrate surface is exposed to a pretreatment process to form hydroxyl groups thereon. The hafnium precursor, $HfCl_4$, and silicon precursor, Tris-DMAS, are heated within separate precursor ampoules at room temperature (about 23° C.). These precursors are vaporized individually in vaporizers at about 110° C. to about 130° C. and individually mixed with an inert carrier gas. The hafnium precursor and the silicon precursor are each simultaneously provided into the chamber for about 1 second. A purge gas of nitrogen is provided into the chamber for about 1 second to remove any unbound hafnium or silicon precursors. Hydrogen gas and oxygen gas with the flow rate of about 100 sccm and about 120 sccm respectively, are supplied to the WVG system. The oxidizing gas comes from the WVG system contains water with a flow rate of about 100 sccm and oxygen with a flow rate of about 70 sccm. The oxidizing gas is provided into the chamber for about 1.7 seconds. The purge gas of nitrogen is provided into the chamber for about 5 seconds to remove any unbound or non-reacted reagents, such as byproducts, hafnium precursor, silicon precursor, oxygen and/or water. Each ALD cycle forms about 1 Å of a hafnium silicate film.

Example 7

A hafnium oxide film is grown with an ALD process by sequentially pulsing a hafnium precursor with in-situ steam formed from a WVG system. A substrate surface is exposed to a pretreatment process to form hydroxyl groups thereon. The hafnium precursor, $HfCl_4$, is heated within a precursor ampoule at a temperature from about 150° C. to about 200° C. A nitrogen carrier gas is directed into the precursor ampoule containing the hafnium precursor with a flow rate of about 400 sccm. The hafnium precursor saturates the carrier gas and is provided into the chamber for about 1.5 seconds. A purge gas of nitrogen is provided into the chamber for about 2.5 seconds to remove any unbound hafnium precursor. Forming gas (5 vol % $H_2$ with balance in $N_2$) and oxygen gas each with the flow rate of about 100 sccm are supplied to the WVG system. The oxidizing gas comes from the WVG system contains water with a flow rate of about 2.5 sccm and oxygen with a flow rate of about 98 sccm. The oxidizing gas is oxidizing gas into the chamber for about 1.7 seconds. The purge gas of nitrogen is provided into the chamber for about 2.5 seconds to remove any unbound or non-reacted reagents, such as byproducts, hafnium precursor, oxygen and/or water.

Example 8

A hafnium silicate film is formed during with an ALD process by sequentially pulsing a hafnium precursor with oxidizing gas followed by pulsing a silicon precursor with the oxidizing gas. A substrate surface is exposed to a pretreatment process to form hydroxyl groups thereon. The hafnium precursor, TDEAH, and silicon precursor, TDMAS, are heated within separate precursor ampoules at room temperature (about 23° C.). These precursors are vaporized individually in vaporizers at about 110° C. to about 130° C. and individually mixed with an inert carrier gas. The hafnium precursor saturates the carrier gas and is provided into the chamber for about 1 second. A purge gas of nitrogen is provided into the chamber for about 1 second to remove any unbound hafnium precursor. Forming gas (5 vol % $H_2$ with balance in $N_2$) and oxygen gas each with the flow rate of about 100 sccm are supplied to the WVG system. The oxidizing gas comes from the WVG system contains water with a flow rate of about 2.5 sccm and oxygen with a flow rate of about 98 sccm. The oxidizing gas is provided into the chamber for 1.7 seconds. The purge gas of nitrogen is provided into the chamber for about 5 seconds to remove any unbound or non-reacted reagents, such as hafnium precursor, oxygen and/or water or by-products. A silicon precursor is provided into the chamber for about 1 second. A purge gas of nitrogen is provided into the chamber for about 1 second to remove any unbound precursor or contaminant. The oxidizing gas is provided into the chamber for about 1.7 seconds. The purge gas of nitrogen is provided into the chamber for about 5 seconds. Each ALD cycle forms about 1 Å of a hafnium silicate film.

Example 9

A hafnium silicate film is formed during with an ALD process by simultaneously pulsing a hafnium precursor and a silicon precursor sequentially with oxidizing gas. A substrate surface is exposed to a pretreatment process to form hydroxyl groups thereon. The hafnium precursor, TDEAH, and silicon precursor, TDMAS, are heated within separate precursor ampoules at room temperature (about 23° C.). These precursors are vaporized individually in vaporizers at about 110° C. to about 130° C. and individually mixed with an inert carrier gas. The hafnium precursor and the silicon precursor are each simultaneously pulsed into the chamber for about 1 second. A purge gas of nitrogen is provided into the chamber for about 1 second to remove any unbound hafnium or silicon precursors. Forming gas (0.5 vol % $H_2$ with balance in $N_2$) and oxygen gas each with the flow rate of about 100 sccm are supplied to the WVG system. The oxidizing gas from the WVG system contains water with a flow rate of about 0.25 sccm and oxygen with a flow rate of about 100 sccm. The oxidizing gas is provided into the chamber for about 1.7 seconds. The purge gas of nitrogen is provided into the chamber for about 5 seconds to remove any unbound or non-reacted reagents, such as byproducts, hafnium precursor, silicon precursor, oxygen and/or water. Each ALD cycle forms about 1 Å of a hafnium silicate film.

Example 10

A hafnium oxide film is formed during an ALD process by sequentially pulsing a hafnium precursor with an oxidizing gas produced by a WVG system. A substrate surface is exposed to a pretreatment process to form hydroxyl groups thereon. The hafnium precursor, TDEAH, is heated within a precursor ampoule at a temperature of about 23° C. A nitrogen carrier gas is directed into the precursor ampoule containing the hafnium precursor with a flow rate of about 400 sccm. The hafnium precursor saturates the carrier gas and is provided into the chamber for about 2 seconds. A purge gas of nitrogen is provided into the chamber for about 1.5 seconds to remove any unbound hafnium precursor. Hydrogen gas and oxygen gas with the flow rate of about 100 sccm and about 120 sccm respectively, are supplied to the WVG system. The oxidizing gas coming from the WVG system contains water with a flow rate of about 100 sccm and oxygen with a flow rate of about 70 sccm. The oxidizing gas is provided into the chamber for about 1.7 seconds. The purge gas of nitrogen is provided into the chamber for about 1.5 seconds to remove any unbound or non-reacted reagents, such as byproducts, hafnium precursor, oxygen and/or water. Each ALD cycle forms about 1.1 Å of a hafnium oxide film.

Materials are deposited by dosing chemicals separately in an alternating fashion to achieve the desired film composition or characteristics with selected half reactions. The above half reactions, however, do not dictate the exact bonding connectivity or the stoichiometry of the resulting film. While most of the product compositional stoichiometry is thermodynamically controlled during a chemical reaction, the product compositional stoichiometry may also be kinetically controlled to obtain the desired composition. Thus, the dosing sequence may be modified to effect the overall composition and qualities of the film.

While the foregoing is directed to embodiments of the invention, other and further embodiments of the invention may be devised without departing from the basic scope thereof, and the scope thereof is determined by the claims that follow.

The invention claimed is:

1. A method for depositing a material on a substrate, comprising:
    positioning a substrate on a substrate support within a process chamber that includes a chamber body and a chamber lid comprising a thermally insulating material defining an expanding channel located at a central portion of the chamber lid, the thermally insulating material having a tapered bottom surface extending from the expanding channel to a peripheral portion of the chamber lid, wherein the tapered bottom surface is shaped and sized to substantially cover the substrate, and the process chamber further contains:
        a first conduit coupled to a first gas inlet within the expanding channel; and
        a second conduit coupled to a second gas inlet within the expanding channel, wherein the first conduit and the second conduit are positioned to provide a gas with a circular flow;
    flowing at least one carrier gas through the first and second conduits to form the circular flow;
    exposing the substrate to the at least one carrier gas with the circular flow;

pulsing at least one precursor into the at least one carrier gas; and depositing a material containing at least one element from the at least one precursor onto the substrate.

2. The method of claim 1, wherein the circular flow contains a flow pattern selected from the group consisting of vortex, helix, spiral, and derivatives thereof.

3. The method of claim 1, wherein the chamber lid or a funnel liner attached the chamber lid contains the thermal insulating material.

4. The method of claim 3, wherein the thermally insulating material comprises a material selected from the group consisting of fused quartz, ceramic, sapphire, pyrolytic boron nitrite, derivatives thereof, and combinations thereof.

5. The method of claim 4, wherein the thermally insulating material has a surface finish of at least about 0.051 μm.

6. The method of claim 4, wherein the process chamber further comprises at least one thermally insulating liner selected from the group consisting of an upper process liner, a lower process liner, a slip valve liner, a retaining ring, and combinations thereof.

7. The method of claim 6, wherein a funnel liner is attached to the chamber lid and thermally expands to become aligned and centered with the substrate during a thermal process.

8. The method of claim 1, wherein a first valve is coupled to the first conduit and a second valve is coupled to the second conduit.

9. The method of claim 8, wherein a first gas source is in fluid communication with the first valve and a second gas source is in fluid communication with the second valve.

10. The method of claim 9, wherein the first and second valves enable an atomic layer deposition process with a pulse time of about 2 seconds or less.

11. The method of claim 10, wherein the circular flow contains a flow pattern selected from the group consisting of vortex, helix, spiral, and derivatives thereof.

12. The method of claim 1, wherein a reaction zone containing a volume of about 3,000 cm$^3$ or less is defined between the chamber lid and the substrate receiving surface.

13. The method of claim 12, further comprising adjusting the volume by laterally positioning the substrate support.

14. The method of claim 12, wherein a plasma apparatus is in fluid communication with the reaction zone.

15. The method of claim 1, wherein a water vapor generator containing a catalyst is coupled to the first conduit, and the catalyst comprises an element selected from the group consisting of palladium, platinum, nickel, iron, chromium, ruthenium, rhodium, alloys thereof, and combinations thereof.

16. The method of claim 15, wherein an oxygen source and a hydrogen source are coupled to the water vapor generator.

17. A method for depositing a material on a substrate, comprising:

positioning a substrate on a substrate support within a process chamber containing a chamber body, a chamber lid, and a gas delivery system capable of forming a gas with a circular gas flow;

flowing at least one carrier gas into the process chamber to form the circular gas flow along an expanding channel formed within a thermally insulating material at a central portion of the chamber lid, wherein a tapered bottom surface extends from the expanding channel to a peripheral portion of the chamber lid and the tapered bottom surface is shaped and sized to substantially cover the substrate, and the gas delivery system contains a first conduit coupled to a first gas inlet within the expanding channel, a second conduit coupled to a second gas inlet within the expanding channel, and the first conduit and the second conduit are positioned to provide the gas with the circular gas flow;

exposing the substrate to the at least one carrier gas with the circular gas flow;

flowing a hydrogen source gas and an oxygen source gas into a water vapor generator to form an oxidizing gas containing water vapor, wherein the water vapor generator is in fluid communication with the process chamber through the gas delivery system;

pulsing sequentially at least one precursor and the water vapor into the at least one carrier gas having the circular gas flow; and depositing a material containing oxygen and at least one element from the at least one precursor onto the substrate.

18. The method of claim 17, wherein the circular gas flow contains a flow pattern selected from the group consisting of vortex, helix, spiral, and derivatives thereof.

\* \* \* \* \*